United States Patent
Liaw

(10) Patent No.: US 12,218,139 B2
(45) Date of Patent: Feb. 4, 2025

(54) SEMICONDUCTOR DEVICE WITH METAL STRUCTURE

(71) Applicant: Taiwan Semiconductor Manufacturing Company, Ltd., Hsinchu (TW)

(72) Inventor: Jhon Jhy Liaw, Zhudong Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 395 days.

(21) Appl. No.: 17/566,082

(22) Filed: Dec. 30, 2021

(65) Prior Publication Data

US 2022/0328526 A1  Oct. 13, 2022

Related U.S. Application Data

(60) Provisional application No. 63/172,926, filed on Apr. 9, 2021.

(51) Int. Cl.
 *H01L 27/118* (2006.01)

(52) U.S. Cl.
 CPC ............ *H01L 27/11807* (2013.01); *H01L 2027/11887* (2013.01)

(58) Field of Classification Search
 CPC ..... H01L 27/11807; H01L 2027/11887; H01L 21/823821; H01L 21/823871; H01L 27/092; H01L 27/0924; H01L 29/0673; H01L 29/0847; H01L 29/42392; H01L 29/78696; H01L 23/5283; H01L 27/0207; H01L 29/775; B82Y 10/00; H10B 10/125

USPC .......................................................... 257/206
See application file for complete search history.

(56) References Cited

U.S. PATENT DOCUMENTS

| | | |
|---|---|---|
| 10,756,114 B2 | 8/2020 | Liaw |
| 10,854,635 B2 | 12/2020 | Liaw |
| 2005/0121793 A1* | 6/2005 | Liaw ............ H10B 10/00 257/E23.079 |
| 2006/0038234 A1* | 2/2006 | Liaw ............ H10B 10/00 257/E27.099 |
| 2016/0181257 A1* | 6/2016 | Liaw ............ H01L 23/5286 257/401 |
| 2019/0206893 A1* | 7/2019 | Liaw ............ H01L 23/5283 |

* cited by examiner

*Primary Examiner* — Duy T Nguyen
(74) *Attorney, Agent, or Firm* — Merchant & Gould P.C.

(57) ABSTRACT

A semiconductor device includes a substrate having a first active region disposed in a first region of a substrate and a second active region disposed in a second region of the substrate. A first gate stack is disposed over the first active region and a second gate stack is disposed over the second active region, the first and second gate stacks having elongated shapes oriented in a first direction. A first metal layer is disposed over the first gate stack and the second gate stack. The first metal layer includes first metal layer structures oriented in a second direction orthogonal to the first direction. A second metal layer disposed over the first metal layer. The second metal layer includes second metal layer structures oriented in the first direction. A third metal layer is disposed over the second metal layer. The third metal layer includes a third metal layer structures oriented in the second direction.

20 Claims, 18 Drawing Sheets

SEMICONDUCTOR DEVICE WITH METAL STRUCTURE

CROSS REFERENCE TO RELATED APPLICATION

This application claims the benefit of U.S. Provisional Application No. 63/172,926, filed Apr. 9, 2021, and titled "Semiconductor Circuit," the disclosure of which is hereby incorporated herein by reference.

BACKGROUND

Due to complex process rules, the lack of routing resource is a challenge for the design of integrated circuit (IC), especially in the advance process. In order to own good pin access ability for achieving smaller chip area and better performance, a novel design is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
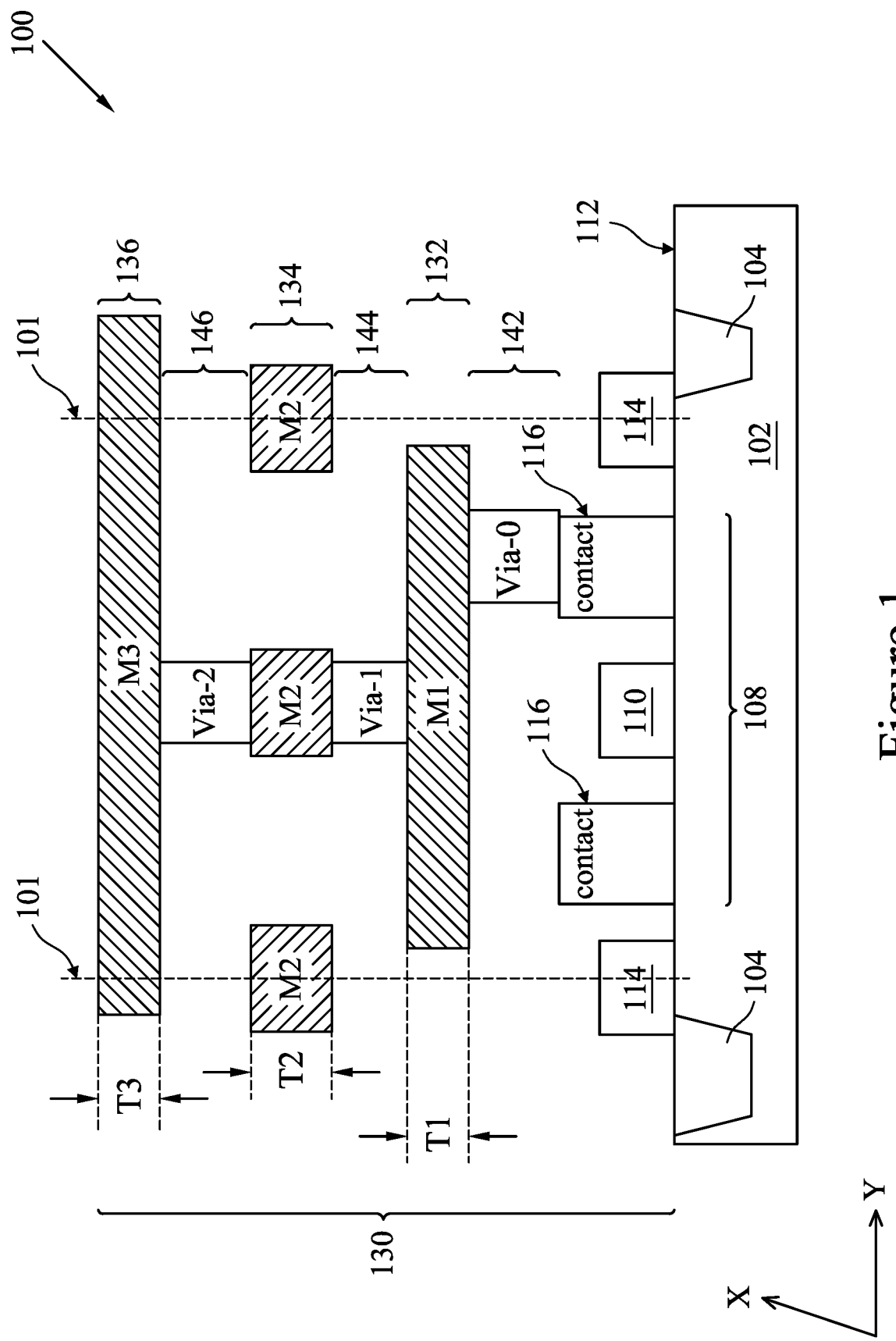
FIG. 1 is a sectional view of a semiconductor structure constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The disclosure provides an optimized layout and metal structure to achieve both high density and high speed applications. FIG. 1 is a sectional view of a semiconductor structure 100 constructed in accordance to some embodiments. In some examples, semiconductor structure 100 is formed on fin active regions and includes Fin Field-Effect Transistors (FinFETs). In other examples, semiconductor structure 100 is firmed on flat fin active regions and include Field-Effect Transistors (FETs) and Gate All Around (GAA) transistors. Semiconductor structure 100 includes one or more standard cells to be incorporated and repeatedly used to Integrated Circuit (IC) designs. Those standard cells may include various basic circuit devices, such as, an inverter, a NAND gate, NOR gate, an AND gate, an OR gate, and a flip-flop, which are popular in digital circuit design for applications, such as, Central Processing Unit (CPU), Graphic Processing Unit (GPU), and System-on-Chip (SOC) designs. For example, semiconductor structure 100 includes a cell defined in dashed lines 101.

Semiconductor structure 100 includes a substrate 102. In examples, substrate 102 includes silicon. Alternatively, substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In other examples, substrate 102 may also include a Silicon-on-Insulator (SoI) substrate. The SoI substrates are fabricated using Separation by Implantation of Oxygen (SIMOX), wafer bonding, and/or other suitable methods.

Substrate 102 also includes various isolation features, such as isolation features 104 formed on semiconductor substrate 102 and defining various active regions on substrate 102, such as an active region 108. Isolation features 104 utilizes isolation technology, such as Shallow Trench Isolation (STI), to define and electrically isolate the various active regions. Isolation features 104 may include silicon oxide, silicon nitride silicon oxynitride, other suitable dielectric materials, or combinations thereof. Isolation features 104 are formed by any suitable process. For example, forming STI features includes a lithography process to expose a portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical Mechanical Polishing (CMP) process. In some examples, the filled trench may have a multilayer structure, such as a thermal oxide linear layer and filling layer(s) of silicon nitride or silicon oxide.

In some examples, active region 108 is a region with semiconductor surface wherein various doped features are formed and configured to one or more device, such as a diode, a transistor, and/or other suitable devices. Active region 108 may include a semiconductor material similar to that (such as silicon) of the bulk semiconductor material of substrate 102 or different semiconductor material, such as Silicon Germanium (SiGe), Silicon Carbide (SiC), or multiple semiconductor material layers (such as alternative silicon and silicon germanium layers) formed on substrate 102 by epitaxial growth, for performance enhancement, such as strain effect to increase carrier mobility.

In examples, active region 108 is three dimensional, such as a fin active region extended above isolation features 104. The fin active region is extruded from semiconductor substrate 102 and has a three dimensional profile for more effective coupling between the channel and the gate electrode of a FET. Active region 108 may be formed by selective etching of recess isolation features 104, or selective epitaxial growth to grow active regions with a semiconductor same or different from that of semiconductor substrate 102, or a combination thereof.

Substrate 102 further includes various doped features, such as n-types doped wells, p-type doped wells, source and drain features, other doped features, or a combination thereof configured to form various devices or components of the devices, such as source and drain features of a field-effect transistor. Semiconductor structure 100 includes various IC devices formed on semiconductor substrate 102. The IC devices includes Fin Field-Effect Transistors (FinFETs), Gate All Around (GAA) transistors, diodes, bipolar transistors, imaging sensors, resistors, capacitors, inductors, memory cells, or a combination thereof. In FIG. 1, exemplary FETs are provided only for illustration.

Semiconductor structure 100 further includes a gate (or gate stack) 110 having elongated shape oriented in a first direction (X direction). In examples, X-direction and Y direction are orthogonal and define a top surface 112 of substrate 102. A gate is a feature of a FET and functions with other features, such as source/drain (S/D) features and a channel; wherein the channel is in the active region and is directly underlying the gate; and the S/D features are in the active region and are disposed on two sides of the gate.

Semiconductor structure 100 also includes one or more interconnection gates 114 formed on semiconductor substrate 102. Interconnection gates 114 also has an elongated shape oriented in the X direction. Interconnection gates 114 are similar to gate 110 in terms of structure, composition, and formation. For example, gate 110 and interconnection gates 114 are collectively and simultaneously formed by a same procedure, such as a gate last process. However, interconnection gates 114 are disposed and configured differently and therefore functions differently. In some examples, interconnection gates 114 are at least partially landing on isolation features 104. For example, interconnection gates 114 are partially landing on active region 108 and partially landing on isolation features 104. Interconnection gates 114, therefore provide isolation between adjacent IC devices and additionally provides pattern density adjustment for improved fabrication, such as etching, deposition and Chemical Mechanical Polishing (CMP). In some examples, interconnection gates 114, therefore, are formed on boundary lines between the adjacent cells. Furthermore, interconnection gates 114 are connected to metal lines through gate contacts and therefore functions as a location interconnection as well.

Gate 110 and interconnection gates 114 have same compositions, formed by a same procedure, and may have a same structure. For example, gate 110 may include a gate dielectric layer (such as silicon oxide) and a gate electrode (such as doped polysilicon) disposed on the gate dielectric layer. In some examples, gate 110 includes other proper material for circuit performance and manufacturing integration. For example, the dielectric layer includes an interfacial layer (such as silicon oxide) and a high k dielectric material layer. The gate electrode includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). The multiple conductive films are designed for work function matching to n-type FET (nFET) and p-type FET (pFET), respectively.

In some examples, gate 110 is formed by a different method with a different structure. For example, gate 110 may be formed by various deposition techniques and a proper procedure, such as gate-last process, wherein a dummy gate is first formed, and then is replaced by a metal gate after the formation the source and drain features. Alternatively, the gate is formed by a high-k-last process, wherein the both gate dielectric material layer and the gate electrode are replaced by high k dielectric material and metal, respectively, after the formation of the source and drain features. In a high-k-last process, a dummy gate is first formed by deposition and patterning; then source/drain features are formed on gate sides and an inter-layer dielectric layer is formed on the substrate; the dummy gate is removed by etching to result in a gate trench; and then the gate material layers are deposited in the gate trench.

Continuing with FIG. 1 semiconductor structure 100 further includes a Multilayer Interconnection (MLI) structure 130. MLI structure 130 is designed and configured to couple various FETs and other devices to form an IC having various logic gates, such as inverters, NAND gates, NOR gates, AND gates, OR gates, flip-flops, or a combination thereof. It is noted that various logic gates each may include multiple FETs and each FET includes a source, a drain and a gate 110. Gate 110 should not be confused with a logic gate. For clarification, sometime, gate 110 is also referred to as transistor gate.

MLI structure 130 includes a first metal layer 132, a second metal layer 134 over first metal layer 132, and a third metal layer 136 over second metal layer 134. Each metal layer of MLI structure 130 includes a plurality of metal layer structures (also referred to as metal lines), such as first metal layer structure ("M1") in first metal layer 132, second metal layer structures ("M2") in second metal layer 134, and third metal layer structures ("M3") in third metal layer 136.

In examples, MLI structure 130 may include more metal layers, such as a fourth metal layer, a fifth metal layer, and so on. In examples, the metal layer structures in each metal layer are oriented in a same direction. For example, first metal layer structures in first metal layer 132 are oriented in the Y direction, second metal layer structures in second metal layer 134 are oriented in the X direction, and third metal layer structures in third metal layer 136 are oriented in the Y direction. The metal layer structures in different metal layers are connected through vertical conductive features (also referred to as vias or via features). The metal layer structures are further coupled to substrate 102 (such as source and drain (S/D) features) through vertical conductive features. In some examples, the S/D features are connected to the first metal layer structures through contact features ("contact") 116 and $0^{th}$ via features ("via-0") 142. Furthermore, the first metal layer structures of first metal layer 132 are connected to the second metal layer structures of second metal layer 134 through first via features ("via-1") 144; and the second metal layer structures of second metal layer 134 are connected to the third metal layer structures of third metal layer 136 through second via features ("via-2") 146. In some example, the third metal layer structures of third metal layer 136 are connected to fourth metal layer structures of a fourth metal layer through third via features ("via-3") and the fourth metal layer structures of the fourth metal layer are connected to fifth metal layer structures of a fifth metal layer through fourth via features ("via-4").

Among those contacts and via features, both contacts 116 and via-0 features 142 are conductive features to provide vertical interconnection paths between substrate 102 and the first metal layer structures of first metal layer 132 but they are different in terms of composition and formation. In addition, contacts 116 and via-0 features 142 may be formed separately. For examples, contacts 116 are formed by a procedure that includes patterning an Interlayer Dielectric (ILD) layer to form contact holes; depositing to fill in the contact holes to form contacts; and may further include a chemical mechanical polishing (CMP) to remove the deposited metal materials from the ILD layer and planarize the top surface. Via-0 features 142 are formed by an independent procedure that includes a similar procedure to form contacts 116 or alternatively a dual damascene process to collectively form via-0 features 142 and the first metal layer structures of first metal layer 132. In some examples, contacts 116 include a barrier layer and a first metal material layer (not shown); and via-0 features 142 include a barrier layer and a second metal material layer (not shown). In various examples, the barrier layer includes titanium, titanium nitride, tantalum, tantalum nitride, other suitable material, or a combination thereof. The first metal material layer includes cobalt, the second metal material layer includes ruthenium, cobalt, copper, or a combination thereof.

In one example, the first metal material layer includes cobalt; the second metal material layer includes tungsten; and the barrier layer includes a first barrier film of tantalum nitride and a second barrier film of tantalum film. In another example, via-0 features 142 are collectively formed with the first metal layer structures of first metal layer 132 in a dual-damascene process, in which via-0 features 142 (and the first metal layer structures as well) include the barrier layer and the second metal material layer of copper (or copper aluminum alloy).

In yet another example, via-0 features 142 include only tungsten. In some other examples where both via-0 features 142 and the first metal layer structures are formed a dual-damascene process, both via-0 features 142 and the first metal layer structures include a material layer stack of a titanium nitride film, titanium film, and cobalt; or a material stack of a titanium nitride film, a titanium film, and a ruthenium film; or a material film stack of a tantalum nitride film and a copper film.

In example embodiments, in MLI structure 130, the metal layer structures in different layers have different dimensional parameters. For example, the first metal layer structures in first metal layer 132 have a first thickness $T_1$, the second metal layer structures in second metal layer 134 have a second thickness $T_2$, and the third metal layer structures in third metal layer 136 have a third thickness $T_3$. The second thickness $T_2$ is greater than the first thickness $T_1$ and the third thickness $T_3$. The third thickness $T_3$ is greater than the first thickness $T_1$. In some examples, a first thickness ratio $T_2/T_1$ is in an approximate range of 1.1 and 2. Similarly, a second thickness ratio $T_2/T_3$ is in an approximate range of 1.1 and 2. In the disclosed structure, those parameters and other subsequently introduced parameters are provided with design values or ranges. The manufactured circuits may experience small variation, such as less than 5% variation. In some embodiments, the first thickness ratio $T_2/T_1$ and second thickness ratio $T_2/T_3$ both range approximately between 1.2 and 2. In yet some other embodiments, the first thickness ratio $T_2/T_1$ and second thickness ratio $T_2/T_3$ both range approximately between 1.3 and 1.8. The ratios are constrained in those ranges such that to effectively increase the routing efficiency and the chip packing density on one side and decrease the intra-cell coupling capacitance and the power lines resistance on another side.

The pitches and widths of various features are further described below. Gates 110 have a minimum pitch $P_g$, the first metal layer structures in first metal layer 132 have a minimum pitch $P_1$, the second metal layer structures in second metal layer 134 have a minimum pitch $P_2$, and the third metal layer structures in third metal layer 136 have a minimum pitch $P_3$. Gates 110 have a width $W_g$, the first metal layer structures in first metal layer 132 have a width $W_1$, the second metal layer structures in second metal layer 134 have a width $W_2$, and the third metal layer structures in third metal layer 136 have a width $W_3$. In some examples, $W_2$ is greater than both the $W_1$ and the $W_3$. For examples, a width ratio of $W_2/W_3$ (which is equal to $W_2/W_1$) is greater than or equal to 1.2.

A pitch of features is defined as the dimension between two adjacent features (measured from same locations, such as center to center, or left edge to left edge). For examples, the gate pitch is the dimension from one gate to an adjacent gate, and the second metal layer structures pitch is the dimension from one to an adjacent one of the second metal layer structures of second metal layer 134. Since pitch may not be a constant, the minimum pitch is defined and constrained above in the disclosed structure. Both gates 110 and the second metal layer structures are oriented in the X direction. The first metal layer structures and the third metal layer structures are oriented in the Y direction.

In example embodiments, interconnection gates 114 and the second metal layer structures in second metal layer 134 have a same minimum pitch but different widths. Particularly, the first pitch ratio $P_g/P_2$ is 1 but $W_2$ usually does not equal to $W_g$. In some examples, the minimum pitch of gates 110 is determined when gates 110 and interconnection gates 114 are collectively considered. Furthermore, the minimum pitch of the second metal layer structures in second metal layer 134 is greater than the minimum pitch $P_3$ of the third metal layer structures in third metal layer 136 which in turn in greater than the minimum pitch $P_1$ of the first metal layer structures in first metal layer 132. For example, a second pitch ration $P_2/P_3$ is in an approximate range of 1.1-2.0. A third pitch ratio $P_3/P_1$ is in an approximate range of 1.1-2.0. In some examples, each of the $P_g$ and the $P_2$ are in an approximate range of 36 nm-52 nm, the $P_1$ is in an approximate range of 20 nm-28 nm, and the $P_3$ are in an approximate range of 25 nm-35 nm.

By utilizing the disclosed structure, the second metal layer structures have a large thickness and large minimum pitch. Thus, the aspect ratio of the second metal layer structures is reduced by the increased minimum pitch and the thickness of the second layer metal structures. In examples, the power lines (such as $V_{dd}$ and $V_{ss}$) are routed in the second metal layer structures, taking the advantages of the greater dimensions and less resistance of the second metal layer structures. The power line routing includes horizontal routing of the power lines being substantially distributed in the second metal layer structures.

In addition, because the second metal layer structures has greater thickness than the first metal layer structures and the third metal layer structures, the second metal layer structures have low resistance and therefore provide design freedom and performance improvement (for example, IR drop reduction). The first metal layer structures and the third metal layer structures with lower thickness and denser pitch provides routing efficiency improvement.

Moreover, the second metal layer structures have a larger minimum metal pitch than the first metal layer structures and the third metal layer structures creating a sandwich metal pitches design (narrow (M1)-wide (M2)-narrow (M3)) provides additional via design features. For example, it enables the vias to be square, slot, or larger. In addition, this also reduces RC (contact resistance) of the vias and provides extra space for via-2 146 layout optimization (either larger slot via or single patterning opportunity from double patterning).

In some examples, semiconductor structure 100 cam include a fourth metal layer having fourth metal layer structures, a fifth metal layer having fifth metal layer structures, a sixth metal layer having sixth metal layer structures. Moreover, semiconductor structure 100 can include third via features (via-3) connecting the third metal layer structures with the fourth metal layer structures, fourth via features (via-4) connecting the fourth metal layer structures with the fifth metal layer structures, and fifth via features (via-5) connecting the fifth metal layer structures with the sixth metal layer structures.

Figure 2A:
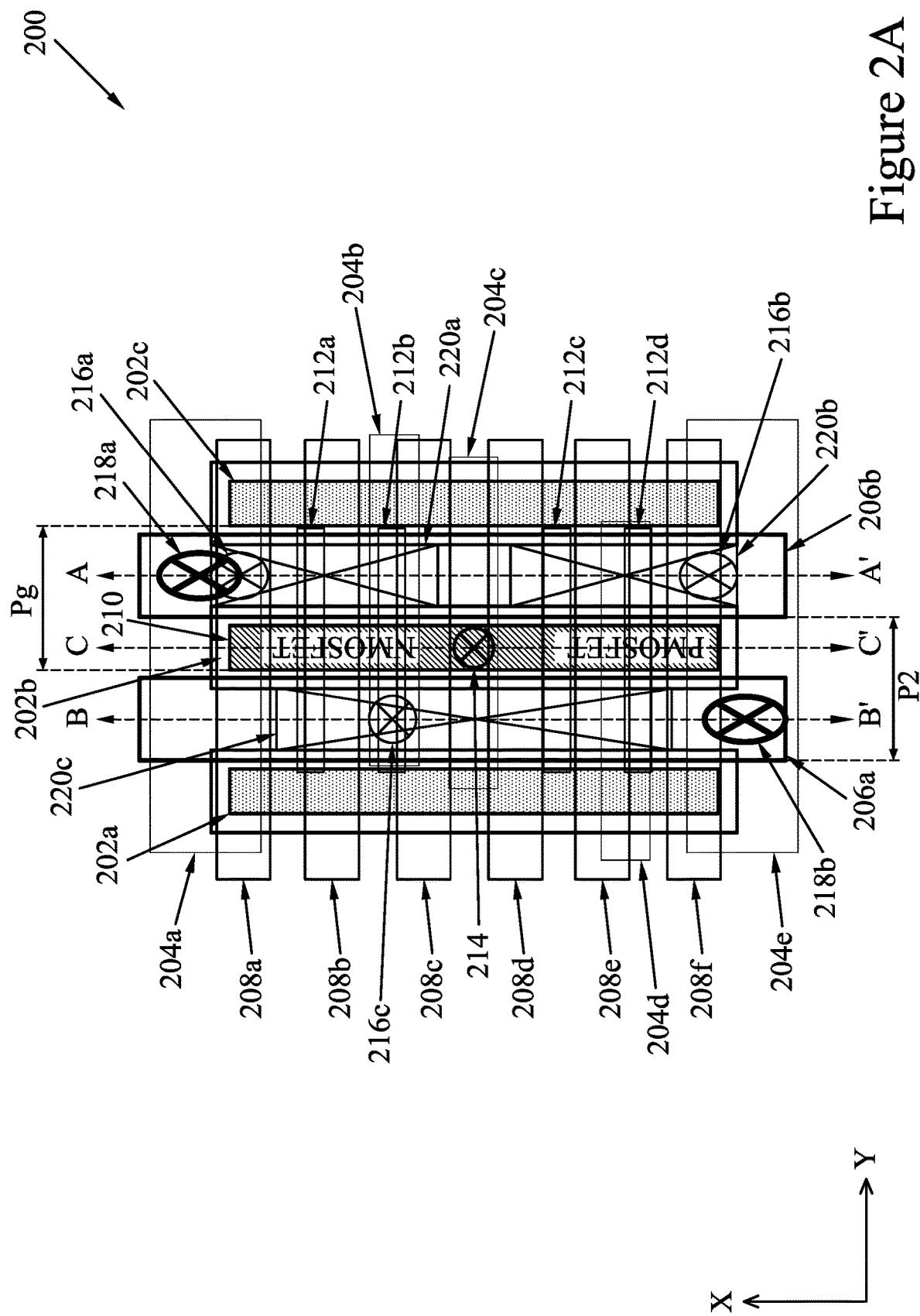
FIG. 2A is a first layout of a semiconductor device in accordance with some embodiments.
Figure 2B:
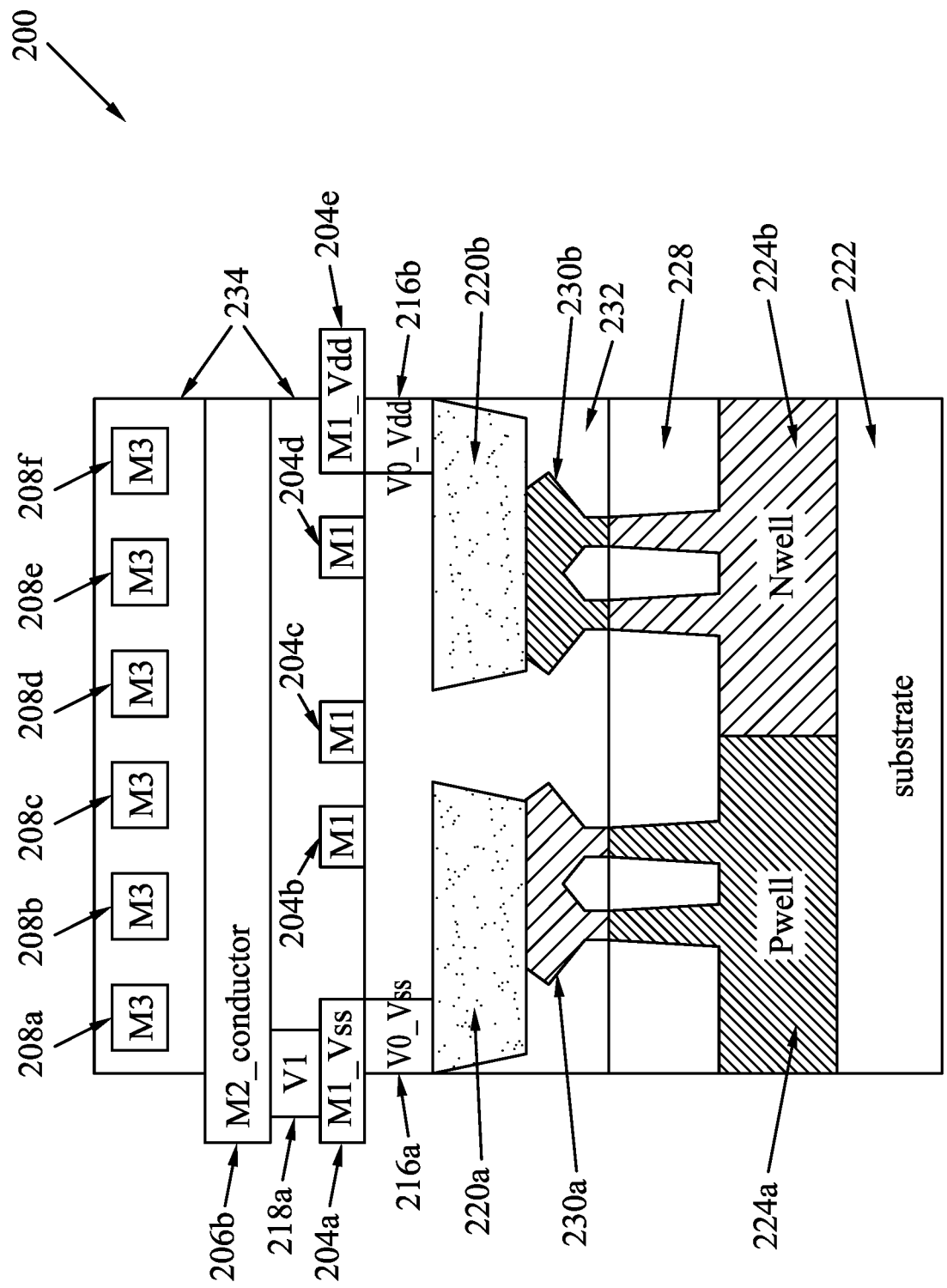
FIG. 2B is a cross-sectional view of line A-A' of the semiconductor device of FIG. 2A in accordance with some embodiments.
Figure 2C:
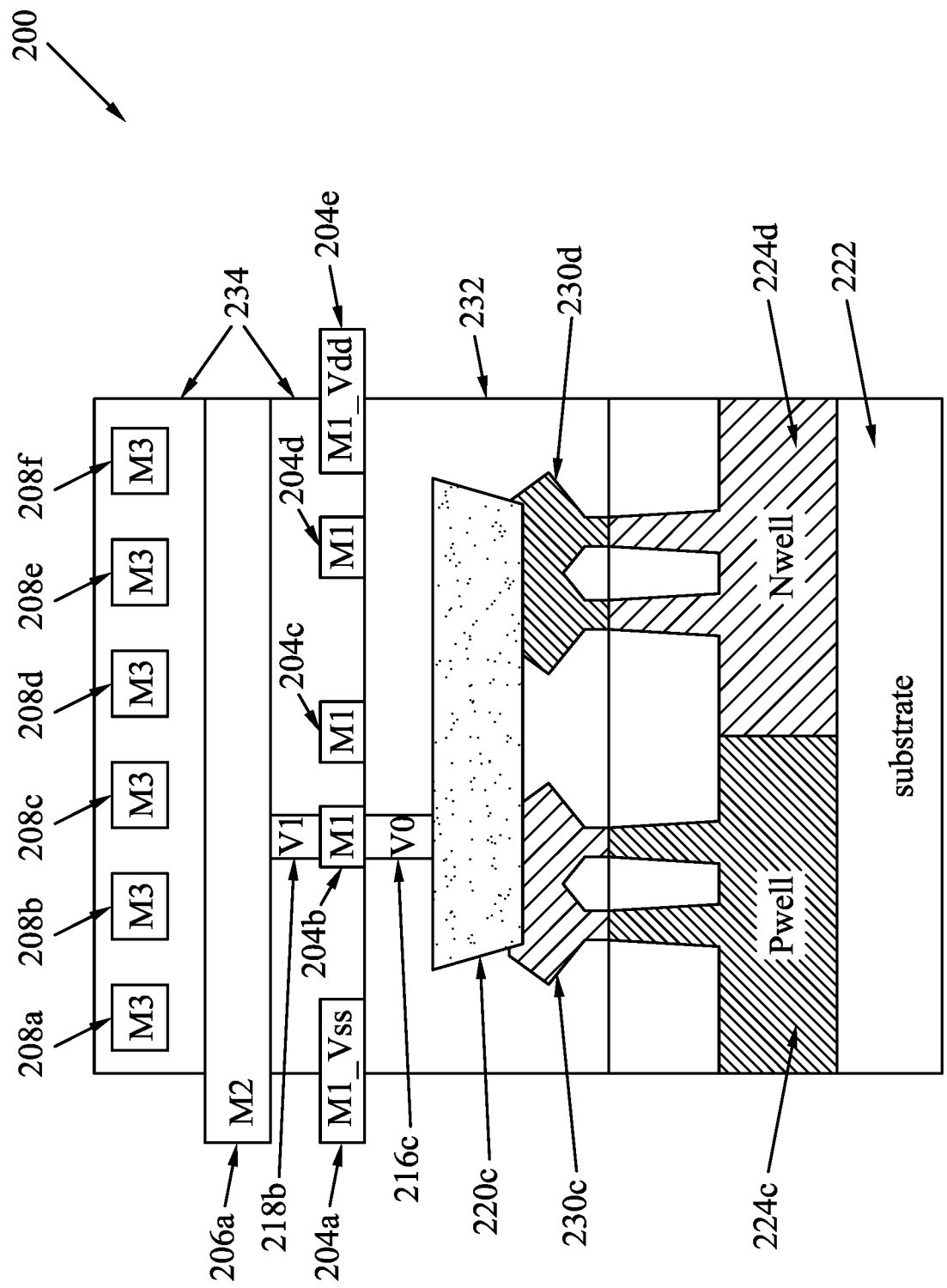
FIG. 2C is a cross-sectional view of line B-B' of the semiconductor device of FIG. 2A in accordance with some embodiments.
Figure 2D:
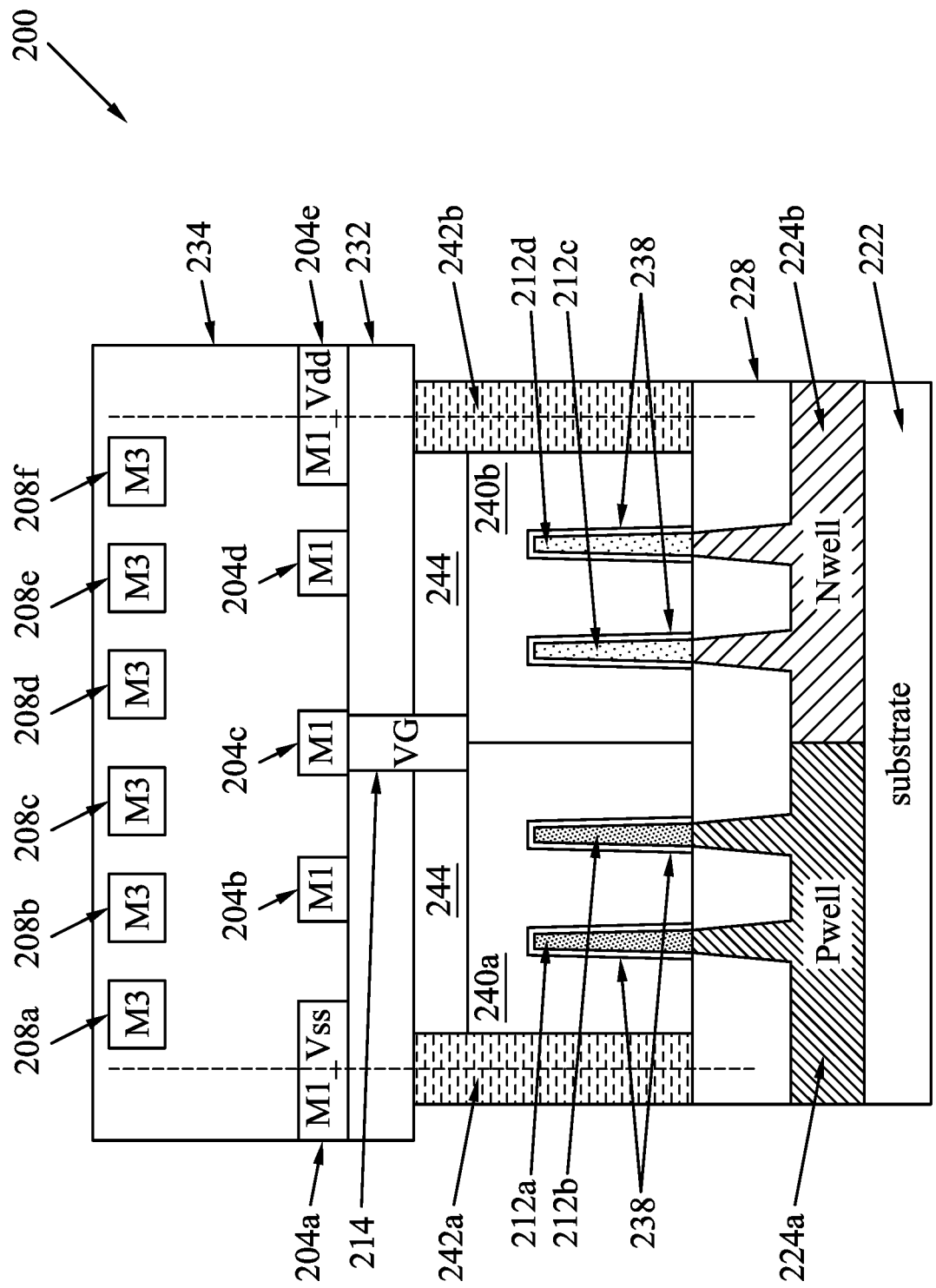
FIG. 2D is a cross-sectional view of line C-C' of the semiconductor device of FIG. 2A in accordance with some embodiments.

FIG. 2A is a first layout of an example semiconductor device 200 in accordance with some embodiments. FIG. 2B is a cross-sectional view of line A-A' of semiconductor device 200 of FIG. 2A. FIG. 2C is a cross-sectional view of line B-B' of semiconductor device 200 of FIG. 2A. FIG. 2D is a cross-sectional view of line C-C' of semiconductor device 200 of FIG. 2A. In some examples, semiconductor device 200 is an FinFET invertor. The invertor includes a N-type metal oxide semiconductor (NMOS) FET and a P-type metal oxide semiconductor (PMOS) FET. In some examples, semiconductor device 200 can include complementary metal oxide semiconductor (CMOS) FETs, or a combination thereof. In some alternative examples, semiconductor device 200 may include 2D-FinFET, 3D-FinFET, or a combination thereof.

Semiconductor device 200 is one embodiment of semiconductor structure 100. Various metal layer structures and gates are oriented, configured, and designed with dimensions as described in semiconductor structure 100. For example, the thickness of second metal layer structures is greater than the thickness of the third metal layer structures which in turn are greater than the thickness of the first metal layer structures. Similarly, the pitch of the second metal layer structures is greater than the pitch of the third metal layer structures which in turn are greater than the pitch of the first metal layer structures.

Referring to FIGS. 2A-2D, semiconductor device 200 includes a plurality of gate structures (that is, a first gate structure 202a, a second gate structure 202b, and a third gate structure 202c (collectively referred to as gate structures 202)), a plurality of first metal layer structures (that is, a first first metal layer structure 204a, a second first metal layer structure 204b, a third first metal layer structure 204c, a fourth first metal layer structure 204d, and a fifth first metal layer structure 204e (collectively referred to as first metal layer structures 204)), a plurality of second metal layer structures (that is, a first second metal layer structure 206a and a second second metal layer structure 206b (collectively referred to as second metal layer structures 206)), a plurality of third metal layer structures (that is, a first third metal layer structure 208a, a second third metal layer structure 208b, a third third metal layer structure 208c, a fourth third metal layer structure 208d, a fifth third metal layer structure 208e, and a sixth third metal layer structure 208f (collectively referred to as third metal layer structures 208), a gate electrode 210, a plurality of fins (that is, a first fin 212a, a second fin 212b, a third fin 212c, and a fourth fin 212d (collectively referred to as fins 212), a gate via 214, a plurality of via-0s (that is, a first via-0 216a (also referred to as source via v0-vss 216a), a second via-0 216b (also referred to as drain via v0-vdd 216b), and a third via-0 216c), a plurality of via-1s (that is, a first via-1 218a and a second via-1 218b), and a plurality of contact structures (that is, a first contact structure 220a, a second contact structure 220b, and a third contact structure 220c (collectively referred to as contact structures 220). The plurality of fins are also referred to as Oxide Diffusion (OD).

Referring to FIGS. 2A-2D semiconductor device 200 further includes a substrate 222, a plurality of well regions (that is, a first well region 224a, a second well region 224b, a third well region 224c, and a fourth well region 224b (collectively referred to as well regions 224), an isolation structure 228, a plurality of S/D structures (that is, a first S/D structure 230a, a second S/D structure 230b, a third S/D structure 230c, and a fourth S/D structure 230d (collectively referred to as S/D structures 230)), a first dielectric layer 232, a second dielectric layer 234, a gate dielectric layer 238, a first work-function metal 240a, a second work-function metal 240b, a first gate end dielectric 242a, a second gate end dielectric 242b, and a gate top dielectric 244.

In examples, substrate 222 may be a semiconductor substrate, such as a bulk semiconductor, a semiconductor-on-insulator (SOI) substrate, or the like, which may be doped (e.g., with a p-type or an n-type dopant) or undoped. Substrate 222 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some examples, the semiconductor material of the substrate 222 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some other examples, substrate 222 includes bulk-Si, SiP, SiGe, SiC, SiPC, Ge, SOI-Si, SOI-SiGe, III-V material, or a combination thereof.

In addition, well regions 224 are formed on substrate 222. In some examples, first well region 224a and third well region 224c include p-type substrate and second well region 224b and fourth well region 224d include a n-type substrate. For example, first well region 224a and third well region 224c may be doped with p-type dopants, such as phosphorus or arsenic. Second well region 224b and fourth well region 224d can be doped with n-type dopants, such as boron or $BF_2$. The fabrication includes performing one or more doping processes, such as implantation processes to form well regions 224 in substrate 222. In some examples, a conductive type of well regions 224 is different from a conductive type of substrate 224, while the conductive type of well regions 224 is the same as a conductive type of fins 212.

In examples, fins 212 (also referred to channels 212) are formed on well regions 224. For example, first fin 212a and second fin 212b are formed on first well region 224a and third fin 212c and fourth fin 212d are formed on second well region 224b. In examples, fins 212 are semiconductor strips extending along a second direction Y. In some examples, fins 212 may be formed on substrate 222 by etching trenches in substrate 222. The etching may be any acceptable etching process, such as a reactive ion etching (RIE) process, neutral beam etching (NBE) process, the like, or a combination thereof. In other examples, the etching process may be an anisotropic process. In the case, as shown in FIGS. 2D, fins 212 protrude from a top surface of well regions 224. In some examples, first fin 212a and second fin 212b includes silicon channels and third fin 212c and fourth fin 212d include silicon channel or silicon-germanium channel. In FIGS. 2A-2D, four fins are illustrated, but the disclosure is not limited thereto. In some examples, fins 212 include at least three semiconductor fins, such as three, four, five, six, or more semiconductor fins.

Isolation structure 228 is disposed over well regions 224. In examples, isolation structure 228 may be an oxide (e.g., silicon oxide), a nitride (e.g., silicon nitride), the like, or a combination thereof, and may be formed by depositing an insulation material in an acceptable deposition process, such as a high density plasma chemical vapor deposition (HDP-CVD), a flowable CVD (FCVD), or the like; planarizing the insulation material in an acceptable planarization process, such as a chemical mechanical polish (CMP), an etch back process, or the like; and recessing the insulation material in an acceptable etching process, such as a dry etching, a wet etching, or a combination thereof. In the case, fins 212 protrude from isolation structure 228. That is, top surfaces of isolation structure 228 are lower than top surfaces of fins 212. Further, the top surfaces of isolation structure 228 may have a flat surface as illustrated, a convex surface, a concave surface (such as dishing), or a combination thereof. In some examples, isolation structure 228 may be a Shallow Trench Isolation (STI) structure.

Gate structures are disposed across fins 212 and extends along the X direction. In some examples, the Y direction and the X direction are different. For example, the Y direction is perpendicular or orthogonal to the X direction. In detail, as shown in FIGS. 2A-2D, one of the gate structures includes gate dielectric layer 238 and gate electrode 210 (that is, first work-function metal 240a and second work-function metal 240b) over gate dielectric layer 238. Gate dielectric layer 238 conformally covers surfaces of plurality of fins 212 exposed by isolation structures 228. In examples, gate dielectric layer 238 may be a high-k dielectric material having a k value greater than about 7, and may include a metal oxide or a silicate of Hf, Al, Zr, La, Mg, Ba, Ti, Pb, or a combination thereof. The formation methods of gate dielectric layer 238 may include Molecular-Beam Deposition (MBD), ALD, PECVD, or the like. In other examples, gate dielectric layer 238 may include SiON, $Ta_2O_5$, $Al_2O_3$, nitrogen-containing oxide layer, nitrided oxide, metal oxide dielectric material, Hf-containing oxide, Ta-containing oxide, Ti-containing oxide, Zr-containing oxide, Al-containing oxide, La-containing oxide, high k material (k>5) or a combination thereof. In some examples, gate dielectric layer 238 may include polysilicon, a metal-containing material, such as TiN, TaN, TaC, Co, Ru, Al, a combination thereof, or multi-layers thereof. Although a single gate electrode 238 is shown, any number of work function tuning layers may be disposed between gate dielectric layer 238 and the gate electrode. For example, the gate structure may include a multiple material structure selected from a group consisting of polysilicon/SiON structure, metals/high-k dielectric structure, Al/refractory metals/high-k dielectric structure, silicide/high-k dielectric structure, or a combination thereof, from top to bottom.

Further, gate end dielectrics 242a and 242b (also referred to as spacers) are disposed along sidewalls of the gate structures. Gate end dielectrics 242a, 242b may be formed by conformally depositing a dielectric material and subsequently anisotropically etching the dielectric material. The dielectric material of gate end dielectrics 242a, 242b may include silicon oxide, silicon nitride, silicon oxynitride, SiCN, the like, or a combination thereof. The formation methods of gate end dielectrics 242a, 242b may include forming dielectric material by a deposition such as ALD, PECVD, or the like, and then performing an etch such as an anisotropic etching process.

First S/D structure 230a, second S/D structure 230b, third S/D structure 230c, and fourth S/D structure 230d (collectively referred to as S/D structures 230) are disposed directly over well regions 224. In some examples, S/D structures 230 may be epitaxial structures formed by growing epitaxial layers over exposed surfaces of well regions 224. Growing the epitaxy layers on exposed surfaces of well regions 224 may include performing a pre-clean process to remove the native oxide on the surface of well regions 224. Next, an epitaxy process is performed to grow the epitaxial S/D structures 230 on the surfaces of well regions 224. In examples, second S/D structure 230b may be epitaxial structures including SiGe, SiGeC, Ge, Si, or a combination thereof for the PMOS FET. In other examples, first S/D structure 230a may be epitaxial structures including SiP, SiC, SiPC, Si, or a combination thereof for the NMOS FET. In some examples, S/D structures 230 may have facets or may have irregular shapes. The SEG process may use any suitable epitaxial growth method such as, vapor phase epitaxy (VPE), metal-organic CVD (MOCVD), molecular beam epitaxy (MBE), and liquid phase epitaxy (LPE). In some examples, S/D structures 230 may be implanted with dopants using patterned photoresist masks. In some examples, S/D structures 230 may be in situ doped during epitaxial growth.

First contact 220a, second contact 220b, and third contact 220c (collectively referred to as contacts 220) are disposed over S/D structures 230 and physically and electrically coupled to S/D structures 230. In some examples, first contact 220a is formed over first S/D structure 230a, second contact 220b is formed over second S/D structure 230b, and third contact 220c is formed over both third S/D structure 230c and fourth S/D structure 230d. Thus, third contact 230c is a longer contact than both first contact 220a and second contact 220b. In some examples, contacts 220 are formed in first dielectric layer 232 between adjacent two gate structures 202. For example, first contact 220a and second contact 220b are formed between second gate structure 202b and third gate structure 202c and third contact 220c is formed between first gate structure 202a and second gate structure 202b. In some examples, contact structures 220 includes a liner, such as a diffusion barrier layer, an adhesion layer, or the like, and a conductive material. The liner may include Ti, TiN, Ta, TaN, the like, or a combination thereof. The conductive material may be Ti, TiN, TaN, Co, Ru, Pt, W, Al, Cu, or a combination thereof. Contact structures 220 may be formed by an electro-chemical plating process, CVD, PVD or the like. The formation of contact structures 220 may include the following steps. First dielectric layer 232 is patterned to form contact trenches (not shown) through a photolithography process and an etching process such as anisotropic process. The conductive material is formed on first dielectric layer 232 and filled in the contact trenches. The conductive material is then planarized in an acceptable planarization process, such as a chemical mechanical polish (CMP), an etch back process, or the like to remove the conductive material over first dielectric layer 232. Therefore, in some examples, contact structures 220 (including first contact structure 220a, second contact structure 220b, and third contact structure 230c) may be substantially at a same level.

In examples, each of contact structures 220 is a rectangular contact having a long side and a short side. The long side of contact structures 220 extends in a same direction as second metal layer structures 206. In some examples, a ratio of the long side to the short side is greater than 2. In the cross-sectional views of FIGS. 2B and 2C, each of contact structures 220 is a slot shape or a trapezoidal shape. That is, a top area of each of contact structures 220 is greater than a bottom area of each of contact structures 220. In some examples, a plurality of silicide layers (not shown) may be formed respectively between contact structures 220 and S/D structures 230 to reduce a resistance between contact structures 220 and S/D structures 230. The silicide layer may include $TiSi_2$, NiSi, PtSi, $CoSi_2$, or combination thereof.

First dielectric layer 232 (also referred to as an Interlayer Dielectric (ILD) layer) is disposed along contact structures 220 and S/D structures 230. In some examples, first dielectric layer 232 may be formed after source via V0-Vss 216a, drain via V0-Vdd 216b, third via V0 216c, and gate via 214 are formed. First dielectric layer 232 may be deposited by any suitable method, such as CVD, plasma-enhanced CVD (PECVD), or FCVD. The dielectric material may include phospho-silicate glass (PSG), borosilicate glass (BSG), boron-doped phospho-silicate glass (BPSG), undoped silicate glass (USG), the like, or a combination thereof. In some examples, first dielectric layer 232 may include a single layer dielectric material or a multi-layer dielectric material.

Second dielectric layer 234 (also referred to as an Inter-Metal dielectric (IMD) layer) is formed over first dielectric layer 232. Second dielectric layer 234 may include a single layer dielectric material or a multi-layer dielectric material, and may be deposited by any suitable method, such as CVD, plasma-enhanced CVD (PECVD), or FCVD. The dielectric material may include phospho-silicate glass (PSG), borosilicate glass (BSG), boron-doped phospho-silicate glass (BPSG), undoped silicate glass (USG), the like, or a combination thereof. In some examples, first dielectric layer 232 and second dielectric layer 234 may have a same material or different materials. In some examples, gate top dielectric 244 may include multiple dielectric material. For example, gate top dielectric 244 can include one or more of $SiO_2$, $Si_3N_4$, carbon doped oxide, nitrogen doped oxide, porous oxide, air gap, or combination.

First metal layer structures 204, second metal layer structures 206, and third metal layer structures 208 are disposed in second dielectric layer 234. In detail, as shown in FIG. 1, first metal layer structures 204 and third metal layer structures 208 extend along the Y direction and second metal layer structures 206 extend along the X direction. In some examples, first metal layer structures 204 are referred to as metal one (M1), second metal layer structures 206 are referred to as metal two (M2), and third metal layer structures 208 are referred to as metal three (M3). That is, each of first metal layer structures 204, second metal layer structures 206, and third metal layer structures 208 are at a different level.

Herein, when elements are described as "at substantially the same level", the elements are formed at substantially the same height in the same layer, or having the same positions embedded by the same layer. In some examples, the elements at substantially the same level are formed from the same material(s) with the same process step(s). In some other examples, the tops of the elements at substantially the same level are substantially coplanar.

In examples, each of first metal layer structures 204, second metal layer structures 206, and third metal layer structures 208 may include a metal material, such as aluminum, copper, nickel, gold, silver, tungsten, or a combination thereof and formed by an electro-chemical plating process, CVD, PVD or the like. In some examples, first metal layer structures 204, second metal layer structures 206, and third metal layer structures 208 are formed before second dielectric layer 234 is formed. First metal layer structures 204, second metal layer structures 206, and third metal layer structure 208 may be formed by forming a metal material on first dielectric layer 232, and patterning the metal material by a photolithography process and an etching process such as anisotropic process. In other examples, first metal layer structures 204, second metal layer structures 206, and third metal layer structures 208 are formed after second dielectric layer 234 is formed.

First metal layer structures 204, second metal layer structures 206, and third metal layer structures 208 may be formed by the following processes. Second dielectric layer 234 is patterned by a photolithography process and an etching process such as anisotropic process to form metal trenches in second dielectric layer 234. A metal material is then formed on second dielectric layer 234 and filled in the metal trenches. The metal material is then planarized in an acceptable planarization process, such as a chemical mechanical polish (CMP), an etch back process, or the like to remove the metal material over second dielectric layer 234.

Each of source via v0-vss 216a, drain via v0-vdd 216b, and third via V0 216c are formed in first dielectric layer 232. Source via v0-vss 216a is disposed between and electrically connects first first metal layer structure 204a and first contact 220a respectively. Drain via v0-vdd 216b is disposed between and electrically connects fifth first metal layer structure 204e and second contact 220b. Thus, each of source via v0-vss 216a, drain via v0-vdd 216b, and third via V0 216c land directly on corresponding contacts. In examples, source via v0-vss 216a and drain via v0-vdd 216b have a larger size than third via V0 216c. For example, a ratio of a top area of source via v0-vss 216a, drain via v0-vdd 216*b* to a top area of third via V0 216*c* is within an approximate range of 1.2-4.0.

In some examples, each of source via v0-vss 216*a*, drain via v0-vdd 216*b*, and third via V0 216*c* may include a liner, such as a diffusion barrier layer, an adhesion layer, or the like, and a conductive material. The liner may include Ti, TiN, Ta, TaN, the like, or a combination thereof. The conductive material may be Ti, TiN, TaN, Co, Ru, Pt, W, Al, Cu, or a combination thereof. In some examples, source via v0-vss 216*a*, drain via v0-vdd 216*b*, and third via V0 216*c* may be formed by an electro-chemical plating process, CVD, PVD or the like. The formation of source via v0-vss 216*a*, drain via v0-vdd 216*b*, and third via V0 216*c* may include the following steps. First dielectric layer 232 is patterned to form via openings (not shown) through a photolithography process and an etching process such as anisotropic process. The conductive material is filled in the via openings and on first dielectric layer 232. The conductive material is then planarized in an acceptable planarization process, such as a chemical mechanical polish (CMP), an etch back process, or the like to remove the conductive material over first dielectric layer 232. Therefore, in some examples, source via v0-vss 216*a*, drain via v0-vdd 216*b*, and third via V0 216*c* may be substantially at a same level.

Gate via 214 is formed in first dielectric layer 232. Gate via 214 is disposed between and electrically connects third first metal layer structure 204*c* and first work-function metal 240*a* and second work-function metal 240*b*. Although only one gate via 214 is illustrated in FIG. 2A-2D, the number of gate via 214 is not limited thereto. In general, gate via 214 are disposed between the gate structures and the first metal layer structures 204, which means the number of gate via 214 is able be adjusted by the number of the gate structures. In examples, gate via 214 includes a liner, such as a diffusion barrier layer, an adhesion layer, or the like, and a conductive material. The liner may include Ti, TiN, Ta, TaN, the like, or a combination thereof. The conductive material may be Ti, TiN, TaN, Co, Ru, Pt, W, Al, Cu, or a combination thereof. Gate via 214 may be formed by an electro-chemical plating process, CVD, PVD or the like.

First first metal layer structure 204*a* and second second metal layer structure 206*b* are used as Vss conductors and fifth first metal layer structure 204*e* is used as Vdd conductor. First first metal layer structure 204*a* is connected to second second metal layer structure 206*b* through first via 218*a*. Shorter contacts connect source nodes of the NMOSFET and the PMOSFET. For example, first contact 220*a* connects to the source node of the NMOSFET and second contact 220*b* connects to the source node of the PMOSFET. The source node of the NMOSFET eventually connects to the VSS conductor and the source node of the PMOSFET eventually connects to the VDD conductor. Longer contact (that is, third contact 220*c* connects drain nodes of the NMOSFET and the PMOSFET. The drain nodes of the NMOSFET and the PMOSFET connect to first second metal layer structure 206*a*.

Figure 3A:
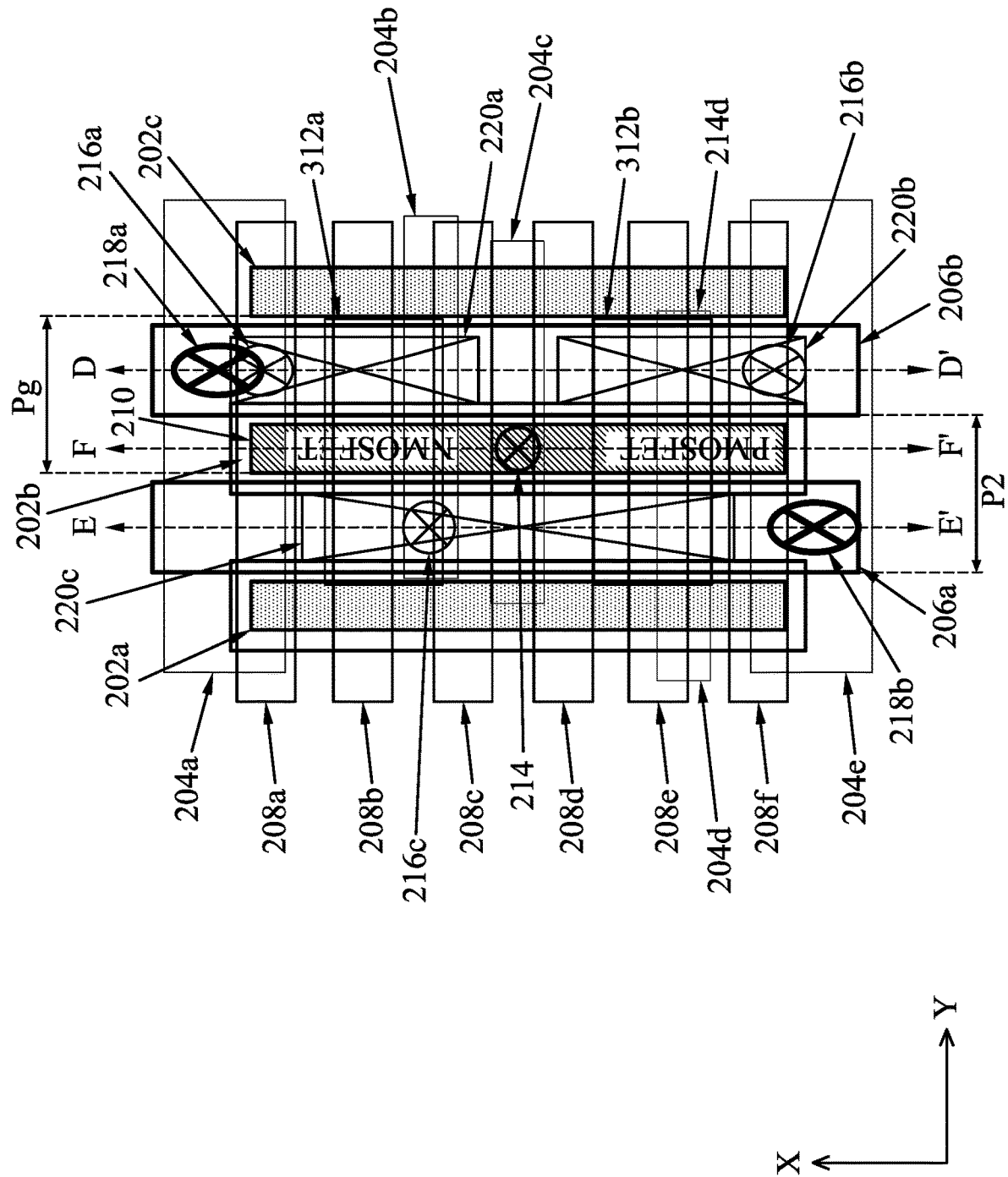
FIG. 3A is a second layout of a semiconductor device in accordance with some embodiments.
Figure 3B:
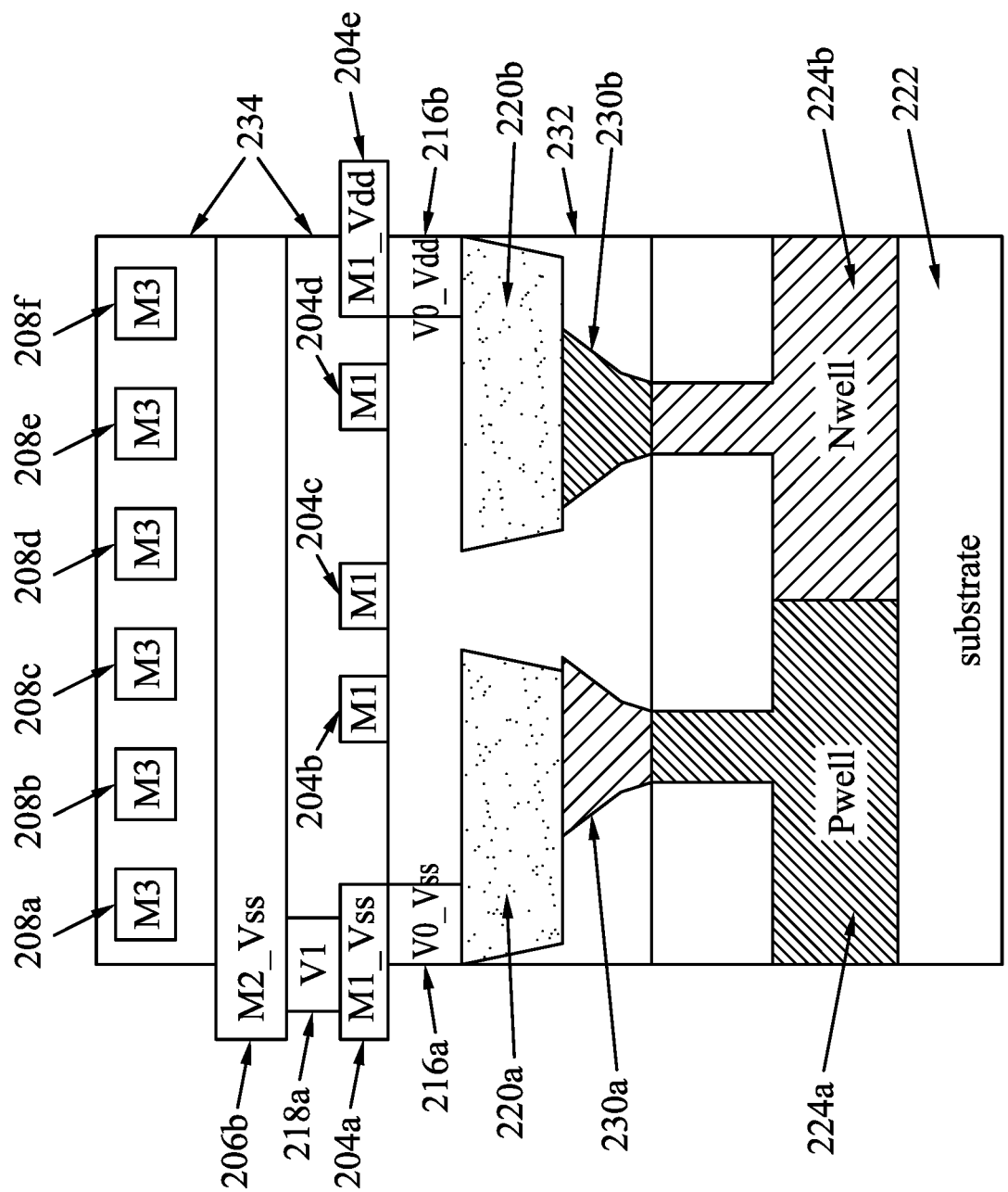
FIG. 3B is a cross-sectional view of line D-D' of the semiconductor device of FIG. 3A in accordance with some embodiments.
Figure 3C:
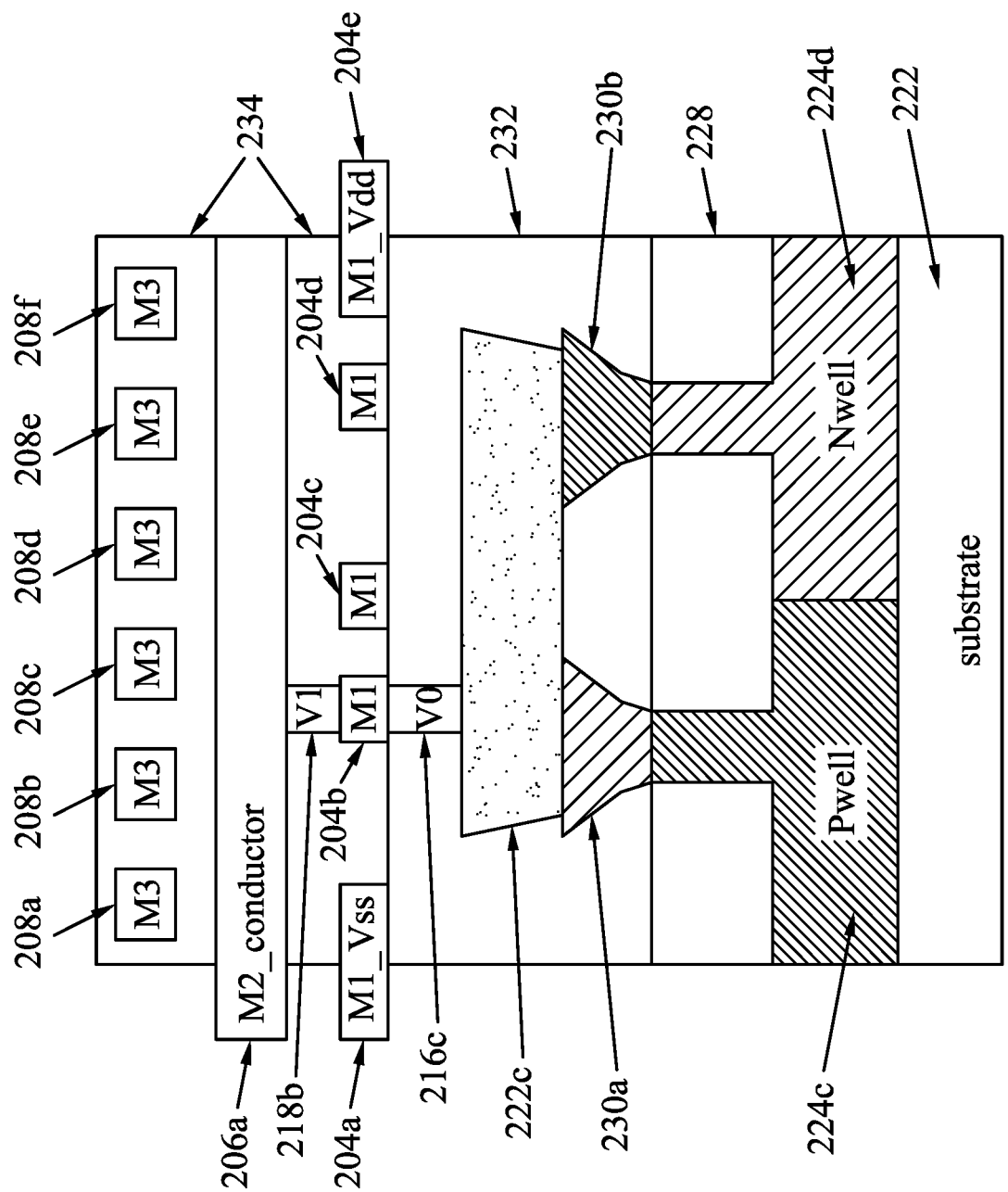
FIG. 3C is a cross-sectional view of line E-E' of the semiconductor device of FIG. 3A in accordance with some embodiments.
Figure 3D:
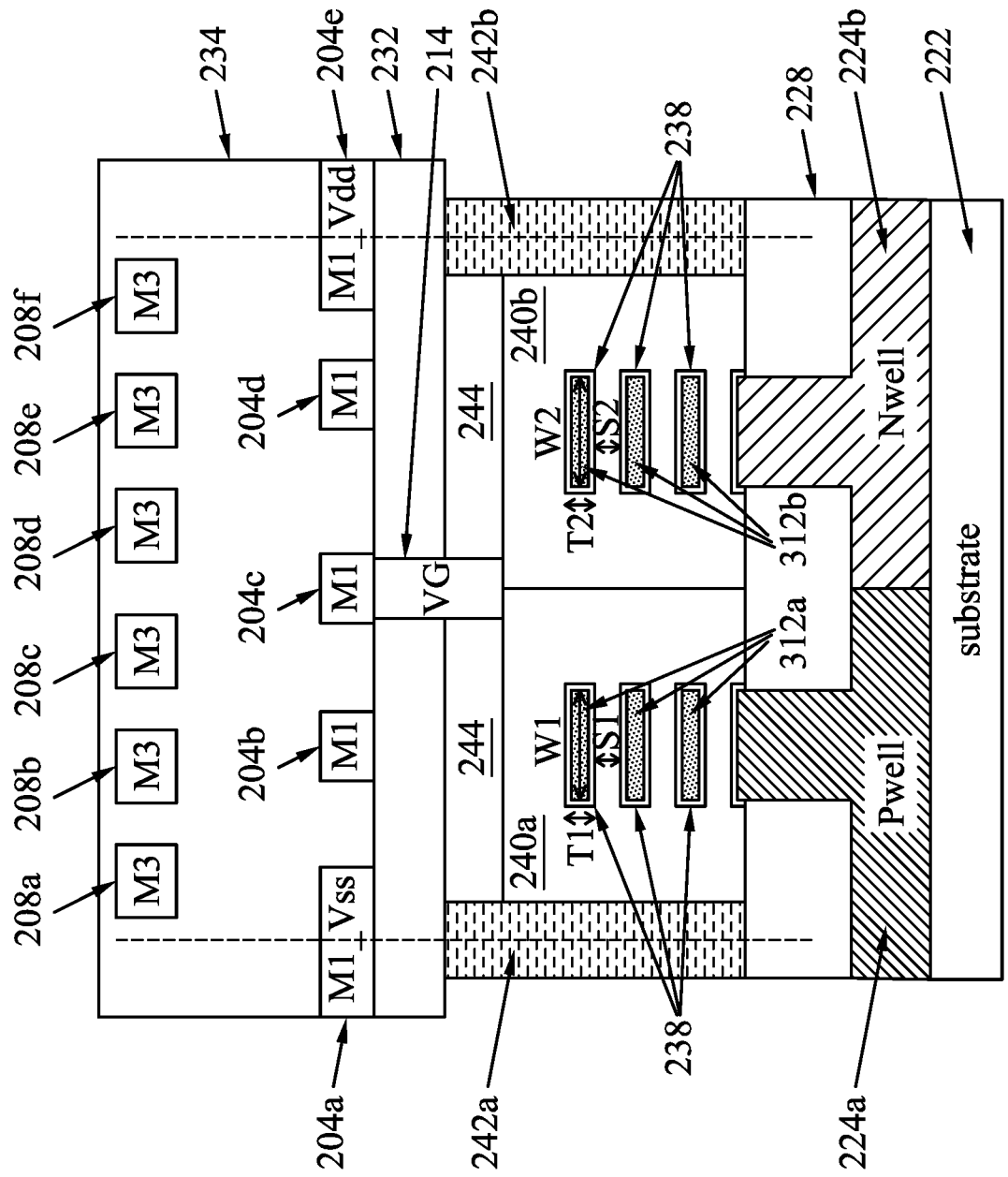
FIG. 3D is a cross-sectional view of line F-F' of the semiconductor device of FIG. 3A in accordance with some embodiments.

FIG. 3A is a second layout of an example semiconductor device 300 in accordance with some embodiments. FIG. 3B is a cross-sectional view of line D-D' of semiconductor device 300 of FIG. 3A. FIG. 3C is a cross-sectional view of line E-E' of semiconductor device 300 of FIG. 3A. FIG. 3D is a cross-sectional view of line F-F' of semiconductor device 300 of FIG. 3A. In some examples, semiconductor device 300 is a GAA invertor.

Semiconductor device 300 is one embodiment of semiconductor structure 100. Various metal layer structures and gates are oriented, configured, and designed with dimensions as described in semiconductor structure 100. For example, the thickness of second metal layer structures is greater than the thickness of the third metal layer structures which in turn are greater than the thickness of the first metal layer structures. Similarly, the pitch of the second metal layer structures is greater than the pitch of the third metal layer structures which in turn are greater than the pitch of the first metal layer structures.

FIGS. 3A-3D follow a similar numbering scheme to that of FIGS. 2A-2D. Though corresponding, some components also differ. To help identify components which correspond but nevertheless have differences, the numbering convention uses 3-series numbers for FIGS. 3A-3D while FIGS. 2A-2D uses 2-series numbers. For brevity, the discussion will focus more on differences between FIGS. 3A-3D and FIGS. 2A-2D than on similarities.

For example, semiconductor device 300 includes first channels 312*a* and second channel 312*b* for the NMOSFET and PMOSFET respectively. Each of first channels 312*a* and second channels 312*b* may include multiple sheets, for example, between 2-6, preferably 3. First channels 312*a* may be Si channels while second channels 312*b* may be either Si channels or SiGe channels. The channels are surrounded by a layer of gate dielectric 238.

In examples, a thickness of first channels 312*a* is represented as T4 and a width of first channels 312*a* is represented by W4. A distance between two consecutive sheets (also referred to as spacer thickness) of first channels 312*a* is represented as S1. A thickness of second channels 312*b* is represented as T5 and a width of second channels 312*b* is represented by W5. A distance between two consecutive sheets of second channels 312*b* is represented as S2. In examples, length of each of channels of first channels 312*a* and second channels 312*b* is within an approximate range of 6 nm-20 nm. In some examples, a width of each of channels of first channels 312*a* and second channels 312*b* is within an approximate range of 4 nm-70 nm. In other examples, the distance between two consecutive sheets for each of first channels 312*a* and second channels 312*b* is within an approximate range of 4 nm-12 nm.

In examples, an effective dielectric constant of an inner spacer has higher K (dielectric constant) value than a top spacer. The material of the inner spacer is selected from of SiO2, Si3N4, SiON, SiOC, SiOCN base dielectric material, air gap, or combination. The top spacer includes multiple dielectric material and selected from SiO2, Si3N4, carbon doped oxide, nitrogen doped oxide, porous oxide, air gap, or combination. The channel region of the vertically stacked multiple channels transistors have a vertical sheet pitch (P=T+S) and is within an approximate range of 10-23 nm. The channel thickness (T) is in an approximate range of 4-8 nm. The vertical sheet pitch is defined by a first channel space(S) and the first channel space(S) is in an approximate range of 6-15 nm.

Figure 4:
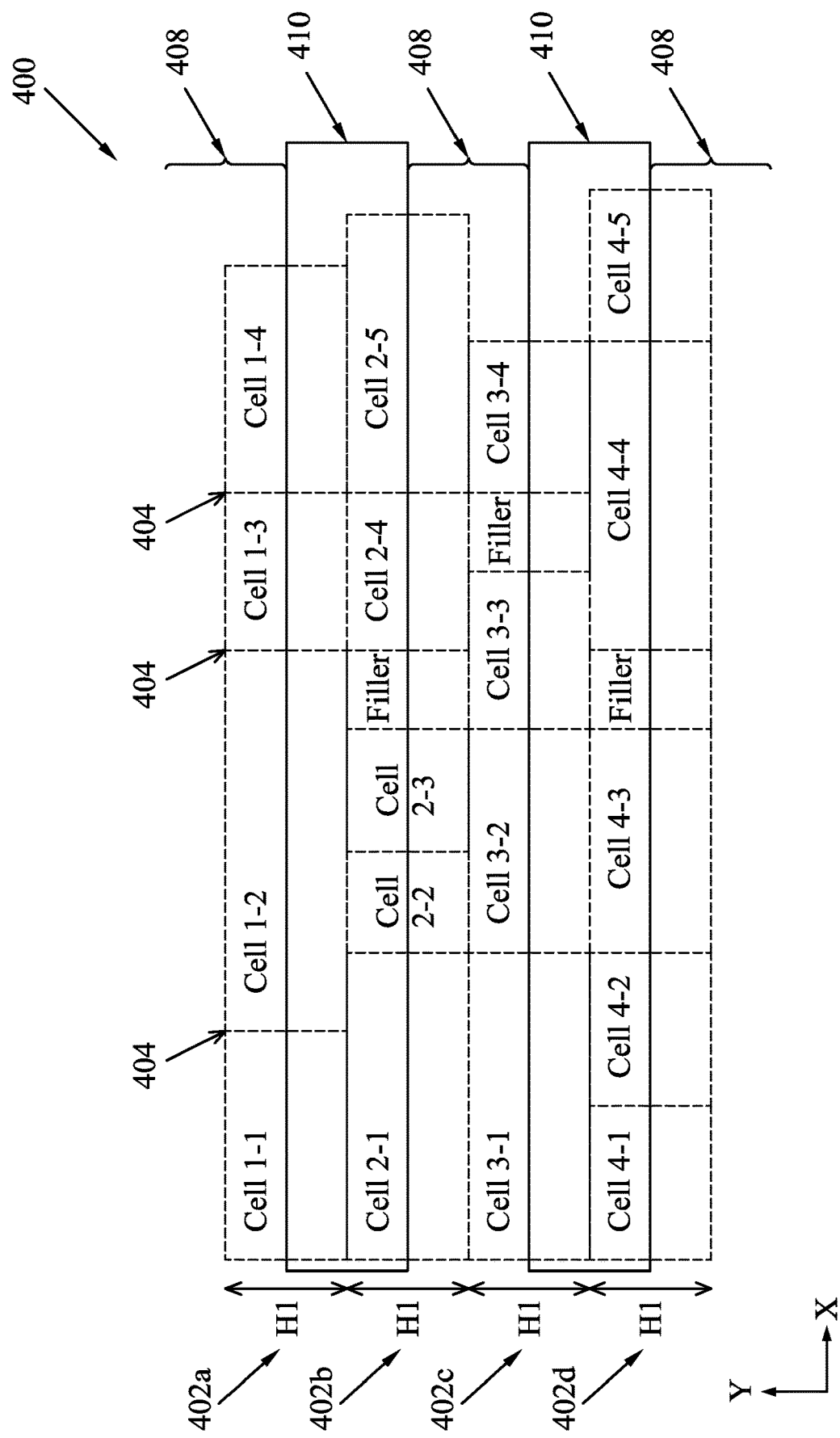
FIG. 4 is a layout of a cell array in accordance with some embodiments.

FIG. 4 is a top view of an example cell array 400 constructed in accordance with some embodiments. Various metal lines and gates of cell array 400 are oriented, configured and designed with dimension as described in semiconductor structure 100. For example, the thickness of the second metal layer structures is greater than the thickness of the third metal layer structures which in turn are greater than the thickness of the first metal layer structures. Similarly, the pitch of the second metal layer structures is greater than the pitch of the third metal layer structures which in turn are greater than the pitch of the first metal layer structures.

Cell array 400 includes multiple rows for cells, for example, a first row 402*a*, a second row 402*b*, a third row 402c, and a fourth row 402d (collectively referred to as rows 402). Each of rows 402 includes multiple cells. For example, first row 402a includes a cell 1-1, a cell 1-2, a cell 1-3, and a cell 1-4. Similarly, second row 402b includes a cell 2-1, a cell 2-2, a cell 2-3, a cell 2-4, and a cell 2-5. Moreover, third row 402c includes a cell 3-1, a cell 3-2, a cell 3-3, a filler cell, and a cell 3-4. In addition, fourth row 402d includes a cell 4-1, a cell 4-2, a cell 4-3, a filler cell, a cell 4-4, and cell 4-5. Each cell of cell array 400 is separated from each other by an isolations structure 404. Each cell in a row may have a same cell height "H1".

Particularly, cell array 400 further includes two N-wells 410 with a P-well 408 interposed between. Various pFETs are formed in the N-wells 410 and various nFETs are formed in the P-well 408. Those PMOSFETs and NMOSFETs are configured and connected to form various cells in cell array 400. Those cells are configured in an abutment mode. With such a configuration, the standard cells can be arranged more efficiently with high packing density.

Figure 5A:
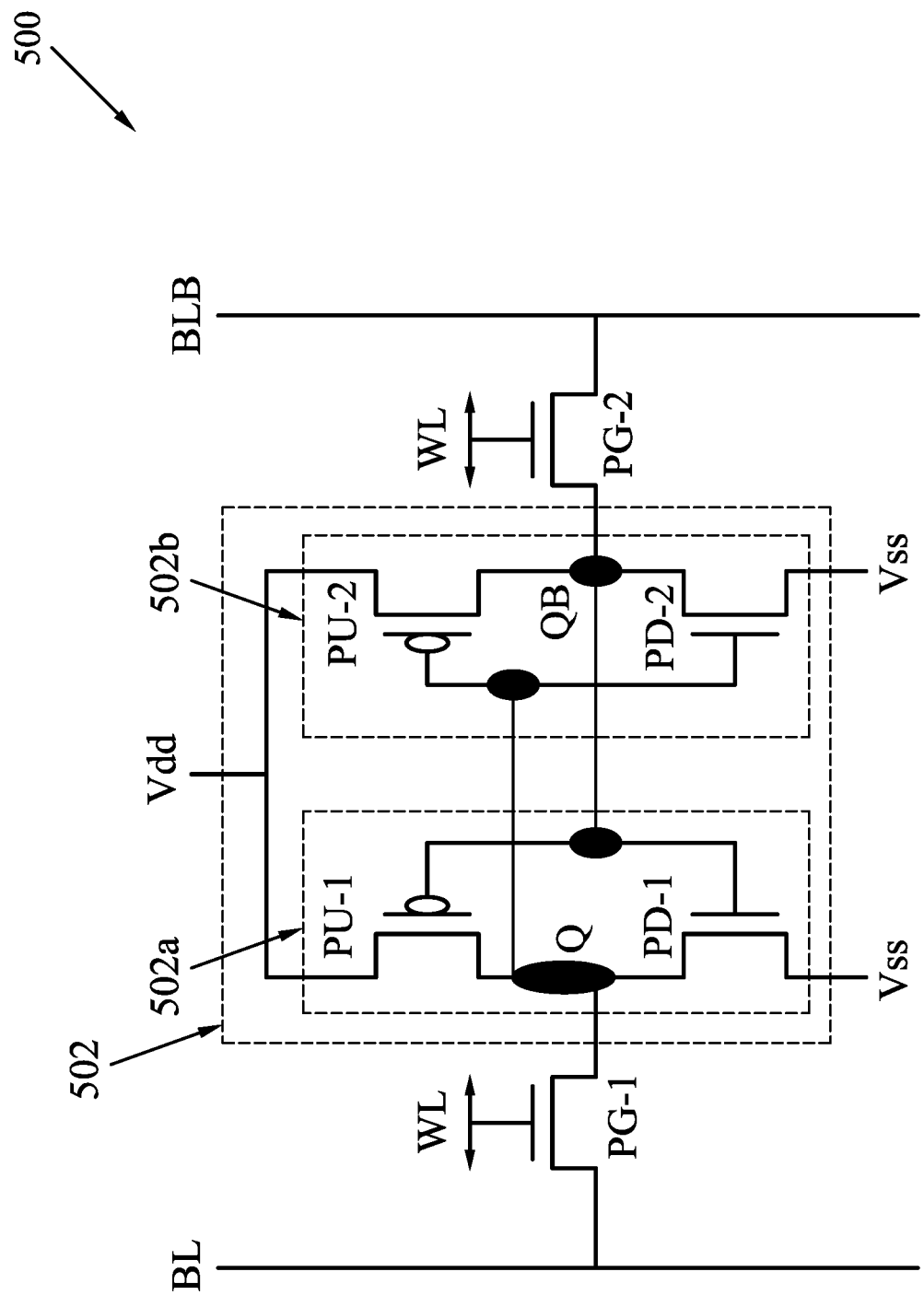
FIGS. 5A and 5B are schematic views of Static Random Access Memory (SRAM) in accordance with some embodiments.
Figure 5B:
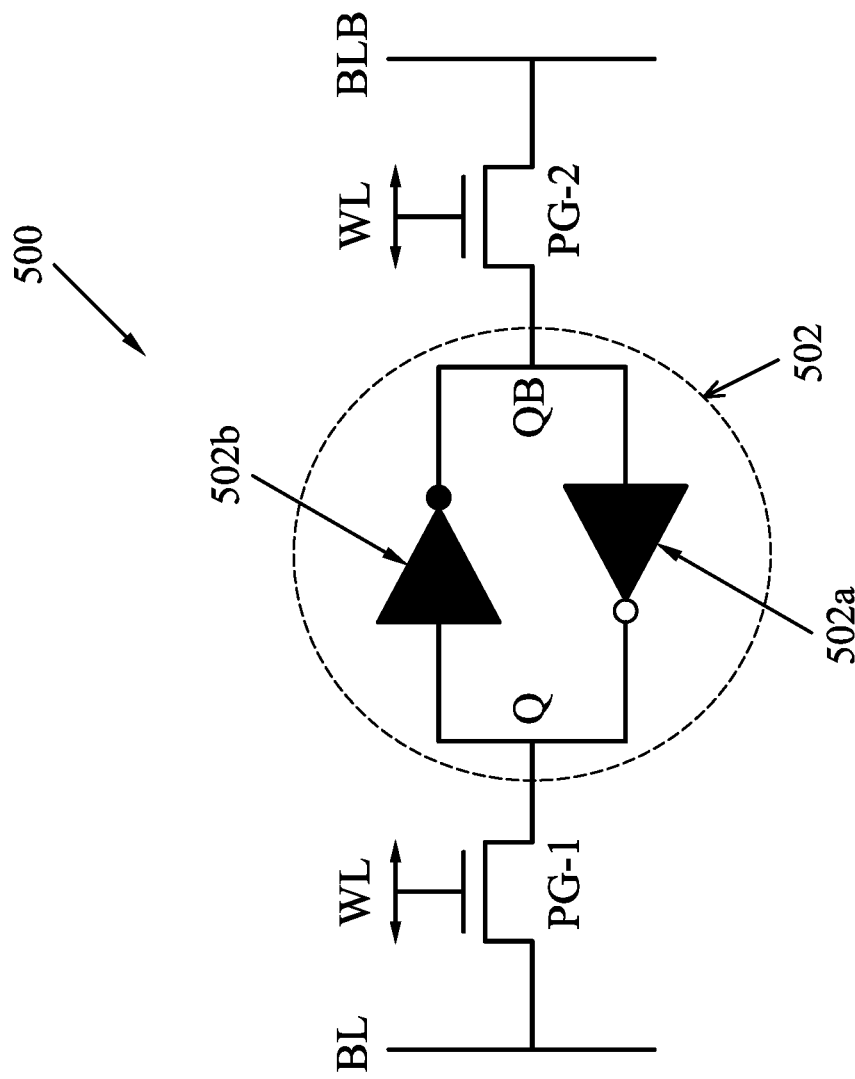

FIGS. 5A and 5B are schematic views of a Static Random Access Memory (SRAM) cell 500 in accordance with some embodiments. In examples, various metal lines and gates of SRAM cell 500 are oriented, configured and designed with dimension as described in semiconductor structures 100, 200, and 300. For example, the thickness of the second metal layer structures is greater than the thickness of the third metal layer structures which in turn are greater than the thickness of the first metal layer structures. Similarly, the pitch of the second metal layer structures is greater than the pitch of the third metal layer structures which in turn are greater than the pitch of the first metal layer structures.

As shown in FIG. 5, SRAM cell 500 includes a cross-coupled inverters 502. Cross couped inverters 502 includes a first inverter 502a and a second inverter 502b. First inverter 502a and second inverter 502b are cross coupled to each other at a first node Q and a second node QB. For example, an output of first inverter 502a is connected to an input of second inverter 502b at the first node Q, and an output of second inverter 502b is connected to an input of first inverter 502a at the second node QB. The first node Q is complementary to the second node QB, and each of the first node Q is complementary to the second node QB are operative to store one bit of data. SRAM cell 500 further includes a first pass gate transistor PG1 coupled to the output of first inverter 502a and the input of second inverter 502b, and a second pass gate transistor PG2 coupled to the output of second inverter 502b and the input of first inverter 502a. Gate electrodes of the first and second pass-gate transistors PG1 and PG2 are coupled to a wordline WL, a source region of the first pass-gate transistor PG1 is coupled to a bitline BL, and a source region of the second pass-gate transistor PG2 is coupled to a complementary bitline BLB, which is the complement of the bitline BL. The data stored at the first node Q accessible through the bitline BL and the first pass gate transistor PG1. The data stored at the second node QB is accessible through the complementary bitline BLB and the second pass gate transistor PG2.

First inverter 502a includes a first pull-up transistor PU1 and a first pull-down transistor PD1. Second inverter 502b includes a second pull-up transistor PU2 and a second pull-down transistor PD2. A pull-up transistor is a P-type transistor of which source/drain is connected to a first voltage potential and a pull-down transistor is an N-type transistor of which source/drain is connected to a second power supply voltage lower than the first voltage potential. For example, source regions of the first and second pull-up transistors PU1 and PU2 are connected to a voltage potential Vdd and source regions of the first and second pull-down transistors PD1 and PD2 are connected to another voltage potential Vss lower than Vdd provided by the power supply circuit. Drain regions of the first pull-up transistor PU1, the first pull-down transistor PD1, and the first pass-gate transistor PG1, and gate electrodes of the second pull-up transistor PU2 and the second pull-down transistor PD2, are connected by the first node Q. Drain regions of the second pull-up transistor PU2, the second pull-down transistor PD2, and the second pass-gate transistor PG2, and gate electrodes of the first pull-up transistor PU1 and the first pull-down transistor PD1, are connected by second node QB. Such features will be more apparent with reference to FIG. 6 which will be described later.

Figure 6:
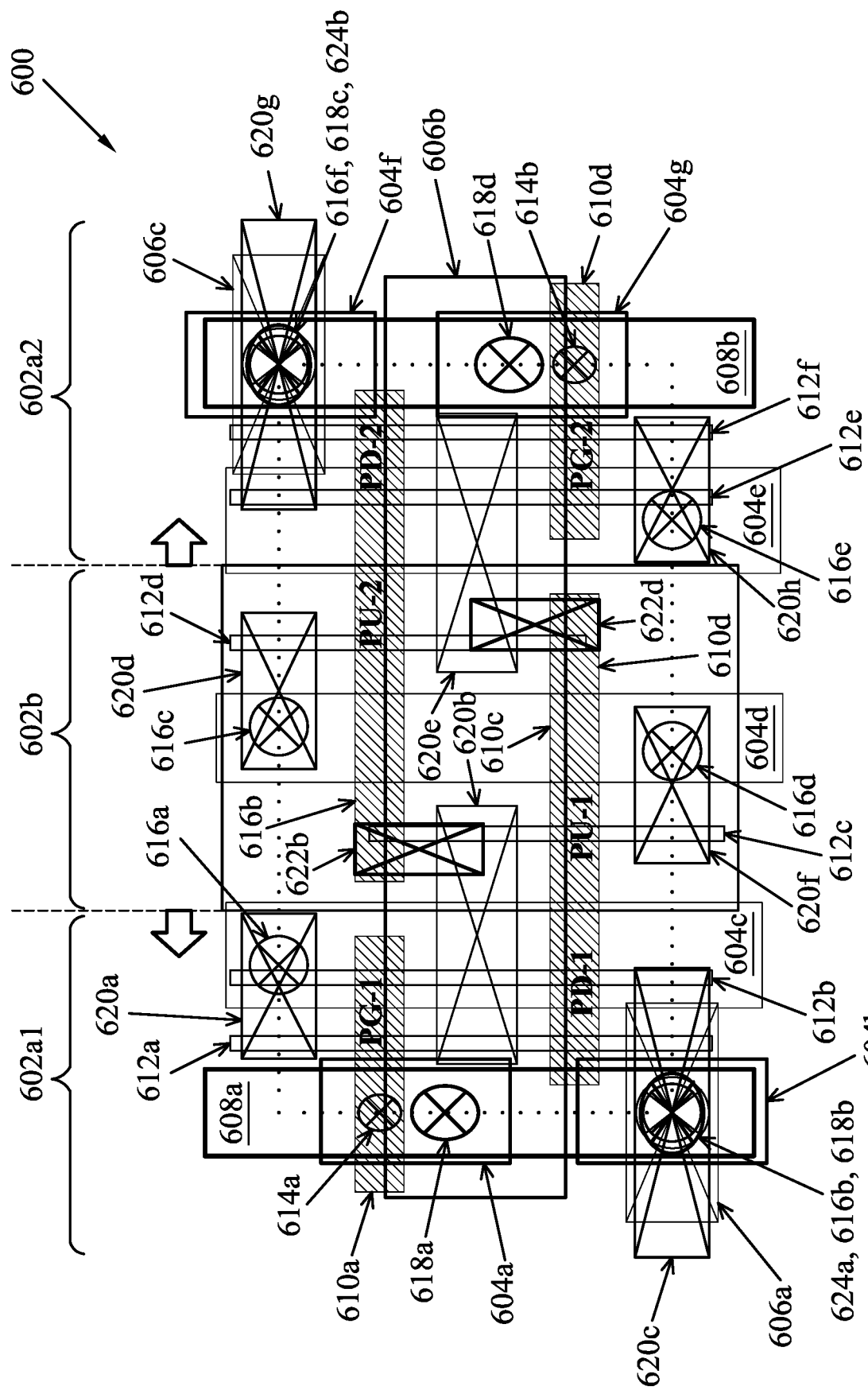
FIG. 6 is a first layout of a SRAM cell in accordance with some embodiments.

FIG. 6 is an example layout 600 of SRAM cell 500 in accordance with some embodiments. In examples, various metal lines and gates of SRAM cell 500 are oriented, configured and designed with dimension as described in semiconductor structures 100, 200, and 300. For example, the thickness of the second metal layer structures is greater than the thickness of the third metal layer structures which in turn are greater than the thickness of the first metal layer structures. Similarly, the pitch of the second metal layer structures is greater than the pitch of the third metal layer structures which in turn are greater than the pitch of the first metal layer structures.

As shown in FIG. 6, layout 600 includes two P-well regions 602a1 and 602a2 with a N-well region 602b interposed between. The first and second pull-up transistors PU1 and PU2 are formed in N-well region 602b. The first pull-down transistor PD1 and the first gate transistor PG1 are formed in first P-well region 602a1. The second pull-down transistor PD2 and the second gate transistor PG2 are formed in second P-well region 602a2.

Layout 600 includes multiple first metal layer structures 604a-604g, multiple second metal layer structures 606a-606c, multiple third metal layer structures 608a-608b, multiple gate electrodes 610a-610d, multiple oxide diffusion structures 612a-612f, multiple gate vias 614a-614b, multiple via-0's 616a-616f, multiple via-1's 618a-618d, multiple contact structures 620a-620h, multiple butt-contact structures 622a-622b, and multiple via-2's 624a- 624b.

In examples, in layout 600, first metal layer structures 604a-604g are used as bit lines, a VDD conductor, and as landing pads. For example, and as shown in layout 600, a third first metal layer structure 604c is used as a bit line BL and fifth first metal layer structure 604e is used as a complimentary bit line BLB. In addition, fourth first metal layer structure 604d is used as a VDD conductor. Remaining of first metal layers structures, that is, first first metal layer structure 604a, second first metal layer structure 604b, sixth first metal layer structure 604f, and seventh first metal layer structure 604g are used as landing pads.

In examples, in layout 600, second metal layer structures 606a-606c are used as a word line and VSS landing pads. For example, and as shown in layout 600, a second second metal layer structure 606b is used as a word line WL and remaining of second metal layers structures, that is, first second metal layer structure 606a and third second metal layer structure 606c are used as VSS landing pads.

Moreover, in layout 600, third metal layer structures 608a-606b are used as a VSS conductors. For example, and as shown in layout 600, both a first third metal layer structure 608a and second third metal layers structures 608b are used as VSS conductors. In addition, fourth metal layer structures (not shown) can be used for an additional word line WL and VSS power mesh layers.

Figure 7:
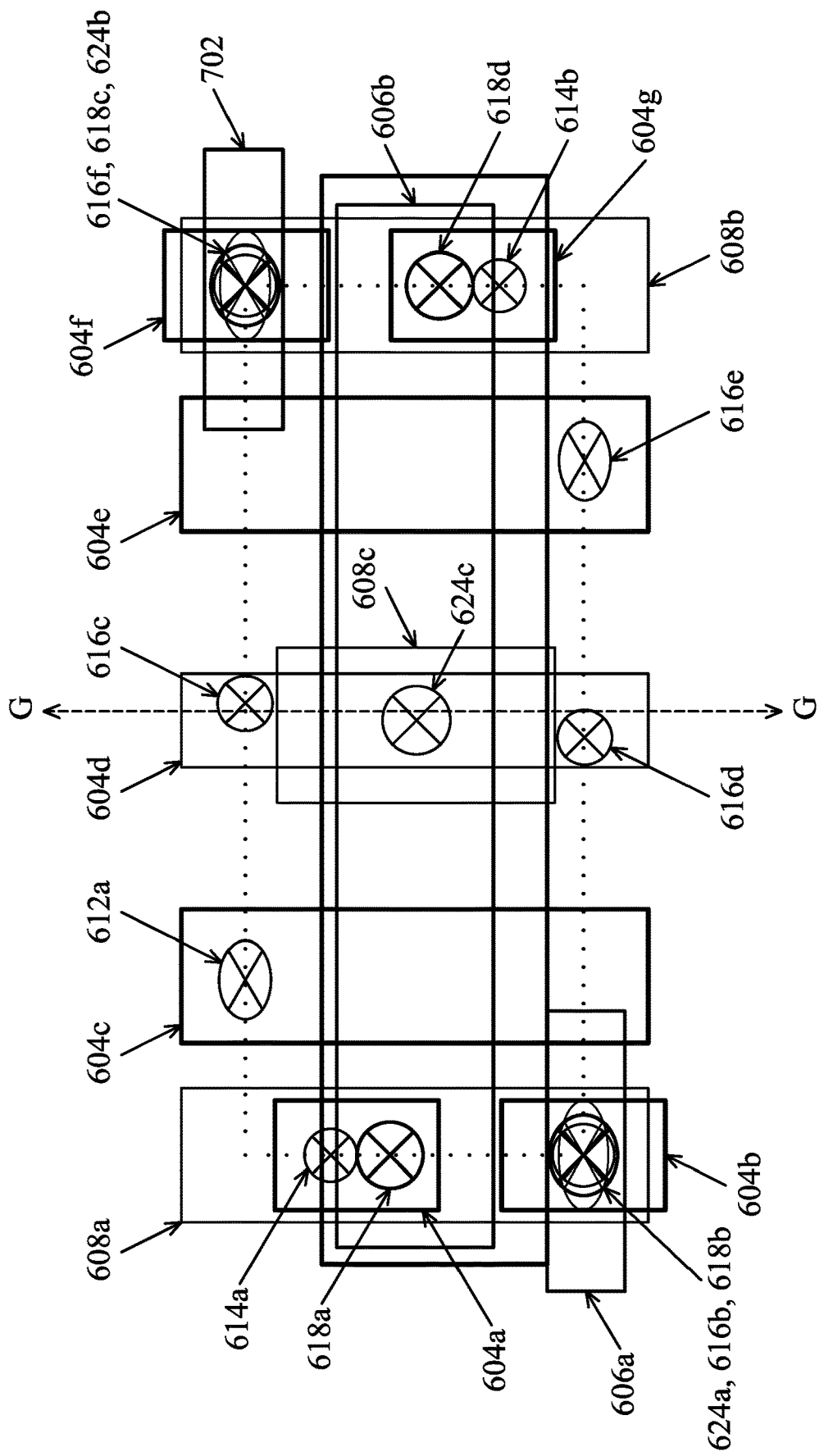
FIG. 7 is a second layout of a SRAM cell in accordance with some embodiments.

FIG. 7 is a second layout 700 of a SRAM cell in accordance with some embodiments. Layout 700 is one embodiment of semiconductor structure 100. Various metal layer structures and gates are oriented, configured, and designed with dimensions as described in semiconductor structure 100. For example, the thickness of second metal layer structures is greater than the thickness of the third metal layer structures which in turn are greater than the thickness of the first metal layer structures. Similarly, the pitch of the second metal layer structures is greater than the pitch of the third metal layer structures which in turn are greater than the pitch of the first metal layer structures.

FIG. 7 follows a similar numbering scheme to that of FIG. 6. Though corresponding, some components also differ. To help identify components which correspond but nevertheless have differences, the numbering convention uses 7-series numbers for FIG. 7. For brevity, the discussion will focus more on differences between FIG. 7 and FIG. 6 than on similarities.

For example, semiconductor device 700 of FIG. 7 includes a fourth metal layer structure 702 (also referred to a metal line four (M4)). Fourth metal layer structure 702 is used as a second word line WL2 for the SRAM cell. In examples, fourth metal layer structure 702 can include TiN, TaN, TiAl, TiAlN, TaAl, TaAlN, TaAlC, TaCN, WNC, Co, Ni, Pt, W, or a combination.

Figure 8:
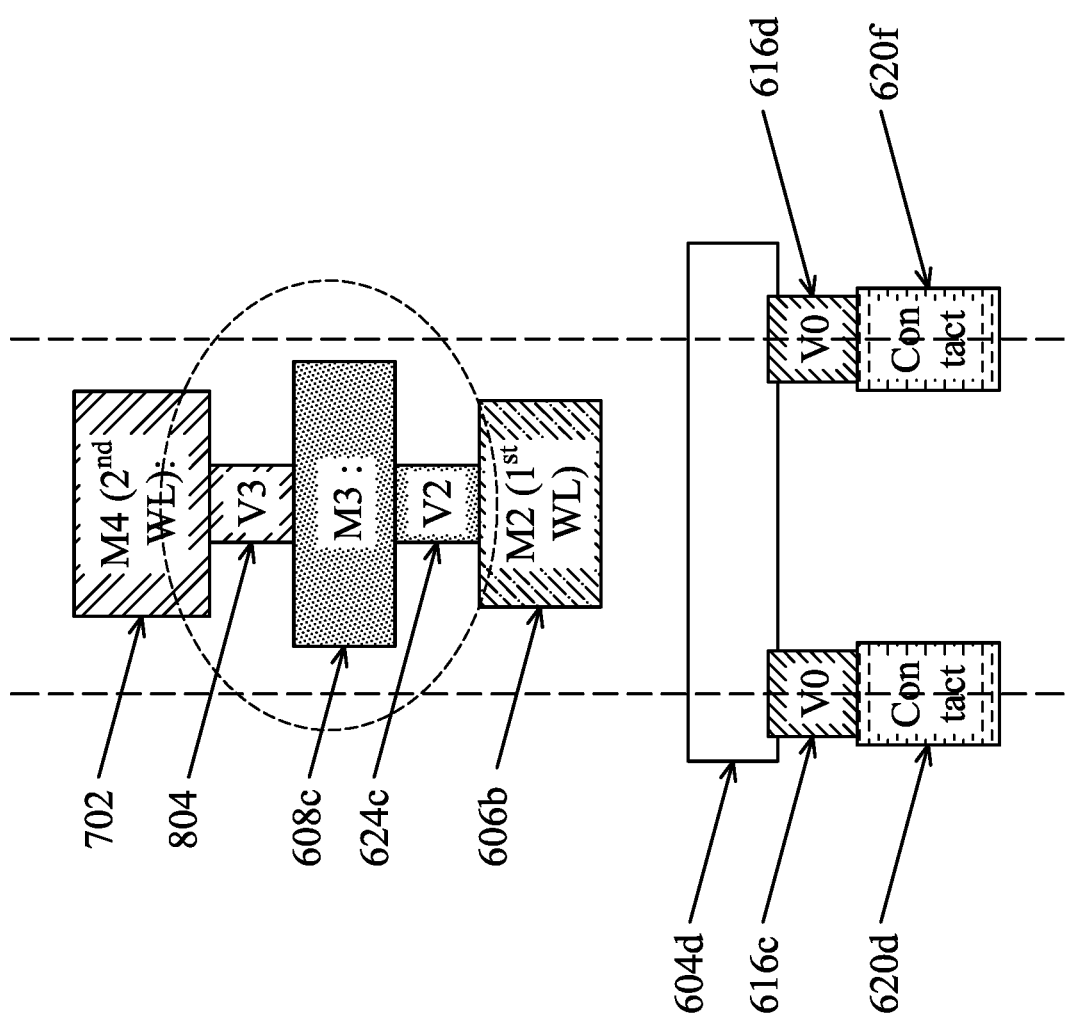
FIG. 8 is a cross-sectional view of line G-G' of the SRAM cell of FIG. 7 in accordance with some embodiments.

FIG. 8 is a cross-sectional view of line G-G' of the SRAM cell of FIG. 7 in accordance with some embodiments. As shown in FIG. 8, fourth metal layer structure 702 is connected to third third metal layer structure 608c through a via-3 804. Third third metal layer structure 608c in turn is connected to second second metal layer structure 606b (which is used as a first word line WL1 for the SRAM cell) through a via-2 624c.

In some example, a shape of a top layer of each of first via-0 616a and sixth via-0 616f is oval have a first diameter D1 and a second diameter D2. The first diameter D1 is longer than the second diameter D2. A ratio of D1/D2 is in an approximate range of 1.5-4.0.

Figures 9A, 9B, 9C:
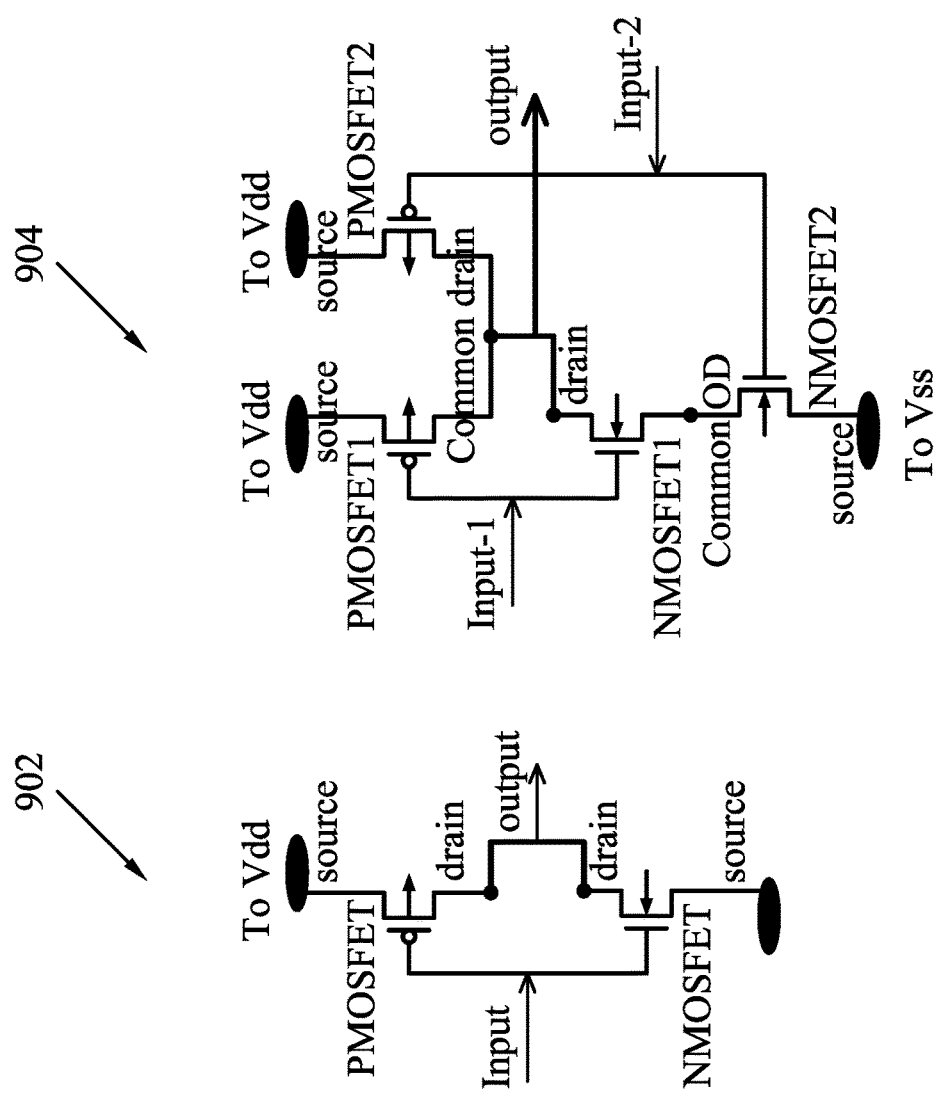
FIG. 9A is a schematic view of an inverter in accordance with some embodiments.
FIG. 9B is a schematic view of a NAND gate in accordance with some embodiments.
FIG. 9C is a schematic view of a NOR gate in accordance with some embodiments.

FIG. 9A is a schematic view of an inverter 902 in accordance with some embodiments. FIG. 9B is a schematic view of a NAND gate 904 in accordance with some embodiments. FIG. 9C is a schematic view of a NOR gate 906 in accordance with some embodiments. As noted above, those gates, contact features, via features and metal lines are configured with dimensions, pitches, and width as described in semiconductor structure 100 of FIG. 1. Those contact features, via features and metal layer structures are routed to connect various gates, sources and drains to form various logic gates that include an inverter 902, a NAND gate 904, and a NOR gate 906. In examples, inverter 902 includes one NMOSFET and one PMOSFET (labeled as "NMOSFET" and "PMOSFET" respectively, in FIG. 9A). NAND gate 904 includes two NMOSFETs and two PMOSFETs (labeled as "NMOFET1", "NMOSFET2", "PMOSTET1", and "PMOSFET2", respectively, in FIG. 9B). NOR gate 906 includes two NMOSFETs and two PMOSFETs (labeled as "NMOSFET1", "NMOSFET2", "PMOSFET1", and "PMOSFET2", respectively, in FIG. 9C). Those NMOSFETs and PMOSFETs are connected as illustrated in FIG. 9A-9C to form inverter 902, NAND gate 904, and NOR gate 906, respectively. Furthermore, each of NAND gate 904 and NOR gate 906 includes a common drain and a common active region ("common OD"). High and low power lines are referred to as "Vdd" and "Vss", respectively, in FIGS. 9A-9C.

Figure 10A:
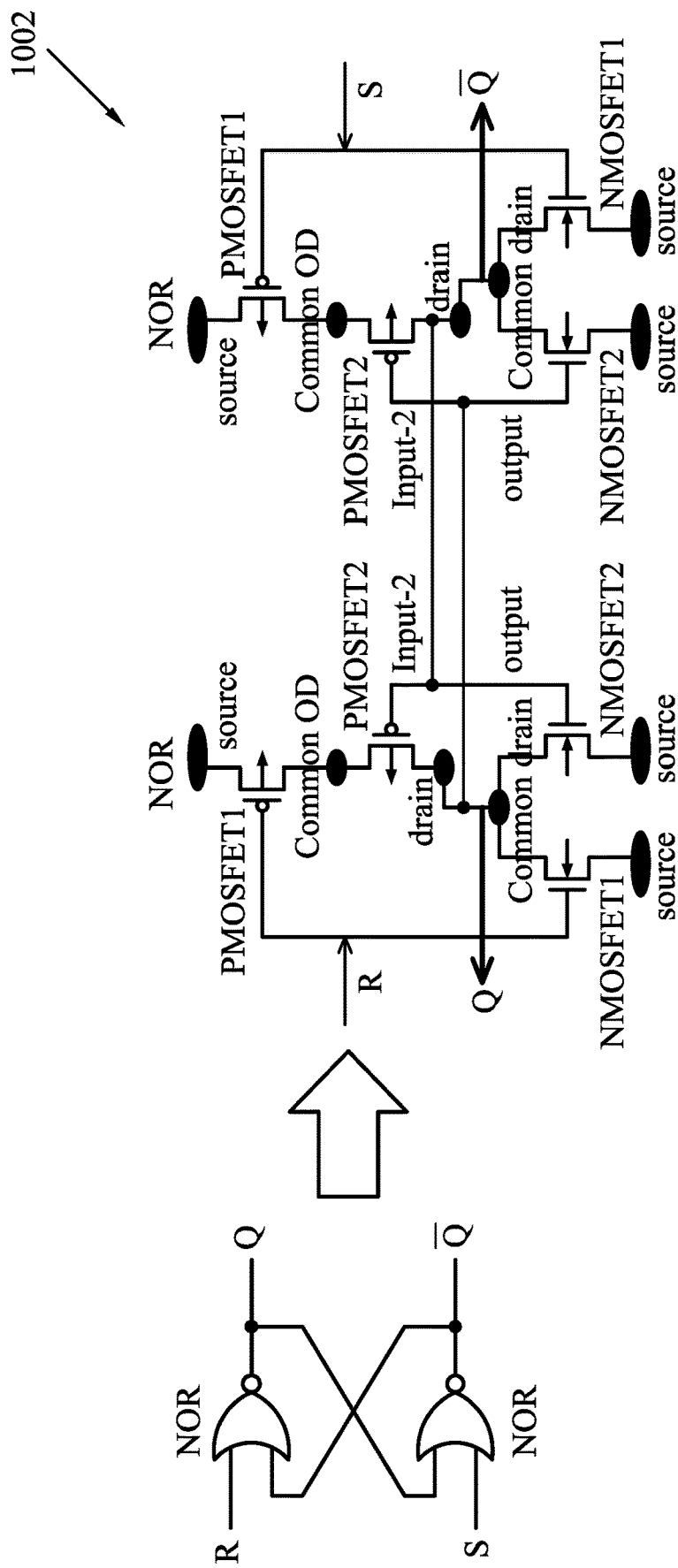
FIG. 10A is a schematic view of an example first flip-flop cell in accordance with some embodiments.
Figure 10B:
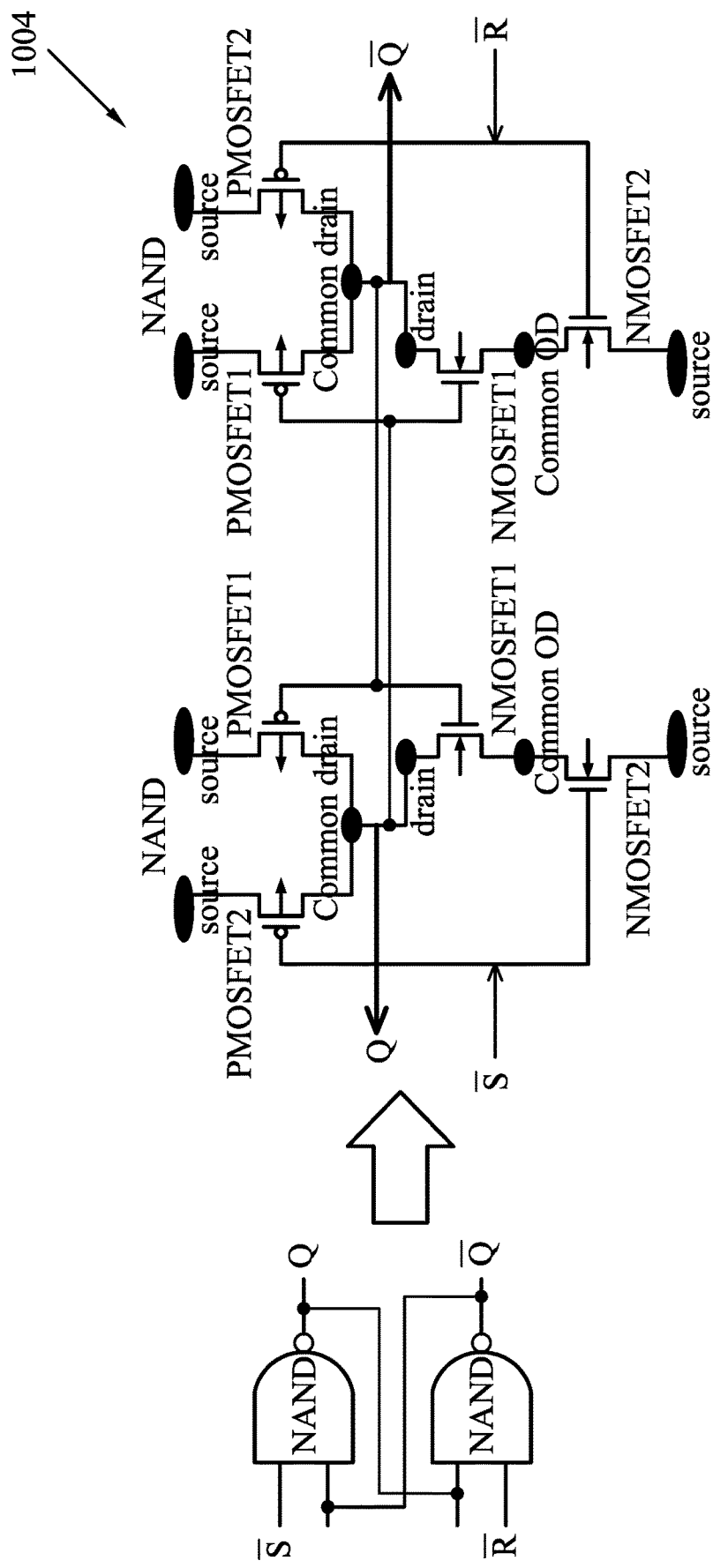
FIG. 10B is a schematic view of an example second flip-flop cell in accordance with some embodiments.

In various embodiments, the standard cells include logic gates, such as an inverter, an NAND logic gate, NOR logic gate. However, the standard cells are not limited to those and may include other standard cells. Those standard cells may be further configured and connected to form another standard cell with a circuit with a different function. For example, a standard cell may be a flip-flop device. FIGS. 10A and 10B illustrates schematic views of two flip-flop devices according two embodiments. First flip-flop device 1002 is formed by two NOR logic gates cross-coupled together according to one embodiment. Second flip-flop device 1004 is formed by two NAND logic gates cross-coupled together according to another embodiment.

In accordance with example embodiments, a semiconductor device comprises: a plurality of gate structures, wherein each gate structure of the plurality of gate structures is arranged to be a gate terminal of a transistor; a plurality of first metal layer structures formed above the plurality of gate structures, wherein each of the plurality of first metal layer structures and one of the plurality of gate structures are crisscrossed from a top view, and wherein each of the plurality of first metal layer structures have a first thickness; a plurality of second metal layer structures formed above the plurality of first metal layer structures, wherein each of the plurality of second metal layer structures and one of the plurality of first metal layer structures are crisscrossed from the top view, and wherein each of the plurality of second metal layer structures have a second thickness; and a plurality of third metal layer structures formed above the plurality of second metal layer structures, wherein each of the plurality of third metal layer structures and one of the plurality of second metal layer structures are crisscrossed from the top view, wherein each of the plurality of third metal layer structures have a third thickness, and wherein the second thickness is greater than both the first thickness and the third thickness.

In example embodiments, a semiconductor device comprises: a substrate having a first region and a second region; a first active region disposed in the first region of the substrate; a second active region disposed in the second region of the substrate; a first gate stack disposed over the first active region and a second gate stack disposed over the second active region, wherein the first gate stack and the second gate stack have elongated shapes oriented in a first direction; a first metal layer disposed over the first gate stack and the second gate stack, wherein the first metal layer comprises a plurality of first metal layer structures oriented in a second direction, the second direction being orthogonal to the first direction; a second metal layer disposed over the first metal layer, wherein the second metal layer comprises a plurality of second metal layer structures oriented in the first direction; and a third metal layer disposed over the second metal layer, wherein the third metal layer comprises a plurality of third metal layer structures oriented in the second direction, wherein: the plurality of first metal layer structures have a first minimum pitch P1, the plurality of second metal layer structures have a second minimum pitch P2, the plurality of third metal layer structures have a third minimum pitch P3, and the second minimum pitch P2 is greater than both the first minimum pitch P1 and the third minimum pitch P3.

In accordance with example embodiments, a semiconductor device comprises: a substrate; a first active region and a second active region over the substrate and oriented lengthwise generally along a first direction; a gate electrode over the substrate and oriented lengthwise generally along a second direction perpendicular to the first direction, wherein the first gate electrode engages the first active region to form a first transistor and engages the second active region to form a second transistor; a first source contact oriented lengthwise generally along the second direction, the first source contact directly contacting a source feature of the first transistor; a second source contact oriented lengthwise generally along the second direction, the second source contact directly contacting a source feature of the second transistor; and a drain contact oriented lengthwise generally along the second direction, the drain contact directly contacting both a drain feature of the first transistor and a drain feature of the second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of gate structures, wherein a first gate structure of the plurality of gate structures is arranged to be a first gate terminal of a first transistor, and wherein a second gate structure of the plurality of gate structures is arranged to be a second gate terminal of a second transistor;
   a plurality of first metal layer structures formed above the plurality of gate structures, wherein each of the plurality of first metal layer structures and one of the plurality of gate structures are crisscrossed from a top view, and wherein each of the plurality of first metal layer structures have a first thickness T1;
   a plurality of second metal layer structures formed above the plurality of first metal layer structures, wherein each of the plurality of second metal layer structures and one of the plurality of first metal layer structures are crisscrossed from the top view, and wherein each of the plurality of second metal layer structures have a second thickness T2; and
   a plurality of third metal layer structures formed above the plurality of second metal layer structures, wherein each of the plurality of third metal layer structures and one of the plurality of second metal layer structures are crisscrossed from the top view, wherein each of the plurality of third metal layer structures have a third thickness T3, wherein the second thickness T2 is greater than both the first thickness T1 and the third thickness T3; and
   a drain contact directly contacting both a drain feature of the first transistor and a drain feature of the second transistor together, wherein the drain contact is longer than each of a first source contact of the first transistor and a second source contact of the second transistor.

2. The semiconductor device of claim 1, wherein the plurality of first metal layer structures have a first minimum pitch $P_1$, wherein the plurality of second metal layer structures have a second minimum pitch $P_2$, wherein the plurality of third metal layer structures have a third minimum pitch P3, wherein the second minimum pitch P2 is greater than both the first minimum pitch P1 and the third minimum pitch P3.

3. The semiconductor device of claim 2, wherein the third minimum pitch P3 is greater than the first minimum pitch P1.

4. The semiconductor device of claim 2, wherein the plurality of gate structures have a minimum pitch Pg, and wherein the second minimum pitch P2 is substantially same as the minimum pitch Pg.

5. The semiconductor device of claim 2, wherein a first ratio of the second minimum pitch P2 over the third minimum pitch P3 is in a range of 1.1-2.0.

6. The semiconductor device of claim 5, wherein the first ratio is 1.2.

7. The semiconductor device of claim 2, wherein a second ratio of the third minimum pitch P3 over the first minimum pitch P1 is in a range of 1.1-2.0.

8. The semiconductor device of claim 1, wherein a first thickness ratio of T2/T3 is equal to or greater than 1.2.

9. The semiconductor device of claim 8, wherein a second thickness ratio of T2/T1 is equal to or greater than 1.2.

10. A semiconductor device comprising:
    a substrate having a first region and a second region, the first active region being associated with a first transistor and the second active region being associated with a second transistor;
    a first active region disposed in the first region of the substrate;
    a second active region disposed in the second region of the substrate;
    a first gate stack disposed over the first active region and a second gate stack disposed over the second active region, wherein the first gate stack and the second gate stack have elongated shapes oriented in a first direction;
    a first metal layer disposed over the first gate stack and the second gate stack, wherein the first metal layer comprises a plurality of first metal layer structures oriented in a second direction, the second direction being orthogonal to the first direction;
    a second metal layer disposed over the first metal layer, wherein the second metal layer comprises a plurality of second metal layer structures oriented in the first direction; and
    a third metal layer disposed over the second metal layer, wherein the third metal layer comprises a plurality of third metal layer structures oriented in the second direction, wherein:
      the plurality of first metal layer structures have a first minimum pitch P1,
      the plurality of second metal layer structures have a second minimum pitch P2,
      the plurality of third metal layer structures have a third minimum pitch P3, and
      the second minimum pitch P2 is greater than both the first minimum pitch P1 and the third minimum pitch P3;
    a drain contact directly contacting both a drain feature of the first transistor and a drain feature of the second transistor together, wherein the drain contact is longer than each of a first source contact of the first transistor and a second source contact of the second transistor.

11. The semiconductor device of claim 10, wherein the first gate stack and the second gate stack have a minimum pitch Pg, and wherein the second minimum pitch P2 is same as the minimum pitch Pg.

12. The semiconductor device of claim 10, wherein a first ratio of the second minimum pitch P2 over the third minimum pitch P3 is in a range of 1.1-2.0, and wherein a second ratio of the third minimum pitch P3 over the first minimum pitch P1 is in a range of 1.1-2.0.

13. The semiconductor device of claim 10, wherein each of the plurality of first metal layer structures have a first thickness T1, wherein each of the plurality of second metal layer structures have a second thickness T2, wherein each of the plurality of third metal layer structures have a third thickness T3, and wherein the second thickness T2 is greater than both the first thickness T1 and the third thickness T3.

14. The semiconductor device of claim 13, wherein a first thickness ratio of T2/T3 is equal to or greater than 1.2, and wherein a second thickness ratio of T2/T1 is equal to or greater than 1.2.

15. The semiconductor device of claim 13, further comprising a first dielectric gate stack disposed between the first region and the second region of the substrate, the first dielectric gate stack electrically isolating the first region from the second region of the substrate.

16. A semiconductor device comprising:
    a substrate;
    a first active region and a second active region over the substrate and oriented lengthwise generally along a first direction;
    a gate electrode over the substrate and oriented lengthwise generally along a second direction perpendicular to the first direction, wherein the gate electrode engages the first active region to form a first transistor and engages the second active region to form a second transistor;
    a first source contact oriented lengthwise generally along the second direction, the first source contact directly contacting a source feature of the first transistor;
    a second source contact oriented lengthwise generally along the second direction, the second source contact directly contacting a source feature of the second transistor; and
    a drain contact oriented lengthwise generally along the second direction, the drain contact directly contacting both a drain feature of the first transistor and a drain feature of the second transistor together.

17. The semiconductor device of claim 16, wherein the drain contact is longer than each of the first source contact and the second source contact.

18. The semiconductor device of claim 16, wherein the first transistor is a p-channel Metal Oxide Semiconductor (PMOS) transistor and the second transistor is a n-channel Metal Oxide Semiconductor (NMOS) transistor.

19. The semiconductor device of claim 16, wherein the first transistor and the second transistor are connected to form an invertor.

20. The semiconductor device of claim 16, further comprising:
    a first metal layer disposed over the first source contact, the second source contact, and the drain contact, wherein the first metal layer comprises a plurality of first metal layer structures oriented in the first direction, the second direction being orthogonal to the first direction;
    a second metal layer disposed over the first metal layer, wherein the second metal layer comprises a plurality of second metal layer structures oriented in the second direction; and
    a third metal layer disposed over the second metal layer, wherein the third metal layer comprises a plurality of third metal layer structures oriented in the first direction.

* * * * *